United States Patent
Lee et al.

(10) Patent No.: US 12,451,352 B2
(45) Date of Patent: Oct. 21, 2025

(54) METHOD FOR FABRICATING SEMICONDUCTOR DEVICE

(71) Applicant: SAMSUNG ELECTRONICS CO., LTD., Suwon-si (KR)

(72) Inventors: Doo Gyu Lee, Suwon-si (KR); Jeong Jin Lee, Suwon-si (KR); Min-Cheol Kwak, Suwon-si (KR); Seung Yoon Lee, Suwon-si (KR); Chan Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 18/373,455

(22) Filed: Sep. 27, 2023

(65) Prior Publication Data

US 2024/0213023 A1    Jun. 27, 2024

(30) Foreign Application Priority Data

Dec. 23, 2022    (KR) .................. 10-2022-0183061

(51) Int. Cl.
*H01L 21/311*    (2006.01)
*H01L 21/027*    (2006.01)
*H01L 21/3213*   (2006.01)
*H01L 21/66*     (2006.01)

(52) U.S. Cl.
CPC .... *H01L 21/0273* (2013.01); *H01L 21/31144* (2013.01); *H01L 21/32139* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 6,150,231 A | * | 11/2000 | Muller | G03F 7/70633 |
| | | | | 438/401 |
| 2007/0035039 A1 | * | 2/2007 | Hyun-Tae | G03F 9/7076 |
| | | | | 257/E23.179 |
| 2008/0220375 A1 | * | 9/2008 | Kim | G03F 7/40 |
| | | | | 430/315 |
| 2015/0255304 A1 | * | 9/2015 | Kang | H01L 21/31144 |
| | | | | 438/696 |
| 2019/0155174 A1 | * | 5/2019 | Kim | G06T 7/001 |

(Continued)

FOREIGN PATENT DOCUMENTS

| | | |
|---|---|---|
| KR | 2001-0081504 A | 8/2001 |
| KR | 2003-0021370 A | 3/2003 |

(Continued)

*Primary Examiner* — Shamim Ahmed
(74) *Attorney, Agent, or Firm* — Muir Patent Law, PLLC

(57) ABSTRACT

A method for fabricating a semiconductor device using an overlay measurement and a semiconductor device fabricated by the method are provided. The method includes forming a lower pattern including a lower overlay key pattern having a first pitch, on a substrate, forming an upper pattern including an upper overlay key pattern having a second pitch different from the first pitch, on the lower pattern, measuring an overlay between the lower overlay key pattern and the upper overlay key pattern, removing the upper overlay key pattern, and after removing the upper overlay key pattern, performing an etching process using the upper pattern as an etching mask.

20 Claims, 25 Drawing Sheets

(56) References Cited

U.S. PATENT DOCUMENTS

| | | | | |
|---|---|---|---|---|
| 2020/0356013 | A1* | 11/2020 | Van Dongen | ....... G03F 7/70633 |
| 2021/0132489 | A1* | 5/2021 | Kim | .................... G03F 7/70683 |
| 2021/0271174 | A1 | 9/2021 | Hsieh et al. | |
| 2022/0199473 | A1 | 6/2022 | Cho et al. | |
| 2022/0392768 | A1* | 12/2022 | Wang | .................... H01L 23/544 |

FOREIGN PATENT DOCUMENTS

| | | | |
|---|---|---|---|
| KR | 2003-0053224 | A | 6/2003 |
| KR | 10-2006-0069999 | A | 6/2006 |
| KR | 10-2006-0110940 | A | 10/2006 |
| KR | 10-2022-003907 | A | 1/2022 |

* cited by examiner

METHOD FOR FABRICATING SEMICONDUCTOR DEVICE

CROSS-REFERENCE TO RELATED APPLICATION

This application claims priority from Korean Patent Application No. 10-2022-0183061 filed on Dec. 23, 2022, in the Korean Intellectual Property Office and all the benefits accruing therefrom under 35 U.S.C. 119, the contents of which in its entirety are herein incorporated by reference.

BACKGROUND

1. Field

Embodiments relate to a method for fabricating a semiconductor device. More specifically embodiments relate to a method for fabricating a semiconductor device using an overlay measurement and embodiments further relate to a semiconductor device that is fabricated using the method.

2. Description of the Related Art

As semiconductor devices become highly integrated, critical dimensions of patterns included in a semiconductor device are becoming finer. As complicated processes and materials are applied, the difficulty of the measurement process is also increasing.

An overlay measurement process is a process of grasping an alignment state between a lower pattern and an upper pattern on a substrate, that is, an overlay. An overlay key for each pattern may be used to accurately grasp the overlay. However, the overlay key may be damaged due to the introduction of new materials and complicated fabricating processes, which may gradually increase a level of difficulty of the overlay measurement.

SUMMARY

Embodiments provide a method for fabricating a semiconductor device, the method including forming a lower pattern including a lower overlay key pattern having a first pitch, on a substrate, forming an upper pattern including an upper overlay key pattern having a second pitch different from the first pitch, on the lower pattern, measuring an overlay between the lower overlay key pattern and the upper overlay key pattern, removing the upper overlay key pattern, and after removing the upper overlay key pattern, performing an etching process using the upper pattern as an etching mask.

Embodiments further provide a method for fabricating a semiconductor device, the method comprising providing a substrate including a cell region and an overlay key region, forming a lower pattern including a lower cell pattern on the cell region and a lower overlay key pattern on the overlay key region, the lower overlay key pattern having a first pitch, forming an upper pattern including an upper cell pattern on the lower cell pattern and an upper overlay key pattern on the lower overlay key pattern, the upper overlay key pattern having a second pitch different from the first pitch, measuring an overlay between the lower overlay key pattern and the upper overlay key pattern, using a Moire pattern formed by the lower overlay key pattern and the upper overlay key pattern, removing the upper overlay key pattern, and after removing the upper overlay key pattern, performing an etching process using the upper cell pattern as an etch mask, wherein an etch endpoint of the etching process is lower than the upper face of the lower cell pattern.

Embodiments further provide a method for fabricating a semiconductor device, the method including providing a substrate including a cell region and an overlay key region, forming a lower pattern including a lower cell pattern on the cell region and a lower overlay key pattern on the overlay key region, the lower overlay key pattern having a first pitch, forming an upper pattern including an upper cell pattern on the lower cell pattern and an upper overlay key pattern on the lower overlay key pattern, the upper overlay key pattern having a second pitch different from the first pitch, removing the upper overlay key pattern, and after removing the upper overlay key pattern, performing an etching process using the upper cell pattern as an etching mask to remove at least a part of the lower cell pattern.

BRIEF DESCRIPTION OF THE DRAWINGS

Features will become apparent to those of skill in the art by describing in detail exemplary embodiments with reference to the attached drawings in which.

DETAILED DESCRIPTION

A method for fabricating a semiconductor device according to exemplary embodiments will be described below with reference to FIGS. 1 to 21.

Figure 1:
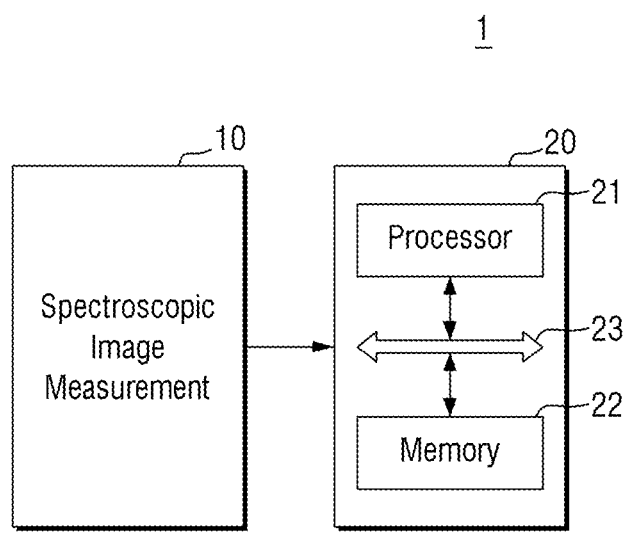
FIG. 1 is an exemplary schematic diagram for explaining an overlay error detection device used in a method for fabricating a semiconductor device according to some embodiments.

FIG. 1 is an exemplary schematic diagram for explaining an overlay error detection device used in a method for fabricating a semiconductor device according to some embodiments.

Referring to FIG. 1, an overlay error detection device 1 according to some embodiments may include a spectroscopic image measurement equipment 10 and a computing system 20.

The spectroscopic image measurement equipment 10 may irradiate a target substrate (for example, a semiconductor wafer W) with measurement light, and measure characteristic values of the target substrate from light reflected from the target substrate. Specifically, the spectroscopic image measurement equipment 10 may analyze the target substrate by detecting a polarization state, diffraction, and the like as reflected by the target substrate. The polarization state may be described as ψ (psi) and Δ (delta), where ψ (psi) is a ratio of reflection coefficients of a p-wave to an s-wave, and Δ (delta) is a phase difference. Therefore, the spectroscopic image measurement equipment 10 may measure a complex refractive index or the like of a substance forming the target substrate according to the wavelength of the measurement light, thereby providing various types of information of the target substrate, including a complex index of refraction, a shape, a crystalline state, a chemical structure, an electrical conductivity, and the like as well as a thickness of a thin film including the target substrate. Accordingly, the spectroscopic image measurement equipment 10 may detect a degree of alignment between the lower film and the upper film.

The computing system 20 may receive data measured by spectroscopic image measurement equipment 10, for example, data relating to the polarization state of the target substrate represented by ψ (psi) and Δ (delta), and analyze the data.

In some embodiments, the computing system 20 may include a processor 21 and a memory 22. The processor 21 and the memory 22 may transmit and receive data through the bus 23. For example, data measured by the spectroscopic image measurement equipment 10 may be stored in the memory 22 of the computing system 20 after being transmitted to the computing system 20. The data measured in the memory 22 may then be shown by a graph through analysis software or applications running on the processor 21 and or may undergo various analysis processes.

The memory 22 may store recipe information, which includes setting information for overlay measurement such as the placement and size of a measurement region, a central wavelength, a bandwidth, and a spectral structure of the measurement light, and kernel 3sigma, periodic ratio, contrast, and the like to represent the degree of overlay error between the lower film and the upper film, as an output file.

The computing system 20 may include, as a non-limiting example, a portable computer such as a desktop computer, a server, a notebook computer, a laptop computer, a mobile computer including a smartphone, or a tablet computer. In some implementations, the computing system 20 may be directly connected (for example, through a cable) to the spectroscopic image measurement equipment 10, and may be connected through a wired network including a LAN (Local Area Network), a WAN (Wide Area Network), and the like, or a wireless network including a WiFi network, a cellular network and the like. The computing system 20 and the measurement equipment 10 may also send and receive data to and from each other.

Figure 2:
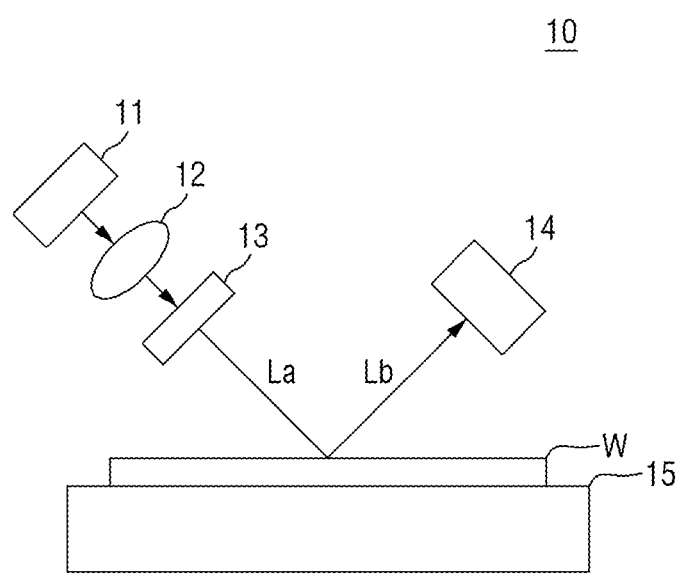
FIG. 2 is an exemplary schematic diagram for explaining the spectroscopic image measurement equipment used in the method for fabricating the semiconductor device according to some embodiments.

FIG. 2 is an exemplary schematic diagram for explaining the spectroscopic image measurement equipment used in the method for fabricating the semiconductor device according to some embodiments.

Referring to FIG. 2, the spectroscopic image measurement equipment 10 according to some embodiments may include a light source 11, a spectroscope 12, a filter 13, an image sensor 14, and a stage 15. The spectroscopic image measurement equipment 10 may use light of mixed lighting, including continuous wavelength bands, as the measurement light La, as non-limiting examples. Light having a short wavelength may also be used depending on the embodiments.

In some embodiments, the light source 11 may, a white light source, as non-limiting example. A spectroscope 12 and a filter 13 may be used to convert the light emitted from the light source 11 into light having a particular wavelength or light having a wavelength of a particular band.

The spectroscope 12 may disperse light emitted from the light source 11 according to wavelength, and provide the dispersed light to the filter 13. The filter 13, which receives the dispersed light, may generate a measurement light La that is irradiated to the semiconductor wafer W, adjust the central wavelength of the measurement light La and the wavelength band of the measurement light La, and determine a spectral structure (e.g., a single pass band or a double pass band) of the measurement light La wavelength.

Although not specifically shown, the light generated from the filter 13 may be polarized by a polarizer, and irradiated to a target substrate, for example, to the semiconductor wafer W positioned on the stage 15, at a predetermined incident angle through an illumination optical system. In some embodiments, the light generated from the filter 13 may be irradiated to the semiconductor wafer W through a compensator as well as a polarizer, or may be irradiated to the semiconductor wafer W through a phase modulator instead of a compensator.

The image sensor 14 may receive a reflected light Lb that is reflected from the semiconductor wafer W. The image sensor 14 may measure a polarization change, a degree of diffraction, an energy size change, and the like as an image to detect an overlay error between the lower film and the upper film. Data collected in the form of images may be transmitted to and processed by the computing system 20 of FIG. 1.

Therefore, the spectroscopic image measurement equipment 10 may measure the semiconductor wafer W. Although not specifically shown, the semiconductor wafer W may be moved onto the stage 15 after being exposed by the exposure device. However, this moving onto the state 15 after being exposed by the exposure device may be merely an example, and the semiconductor wafer W may be moved onto the stage 15 after being etched by the etching device.

Figure 3:
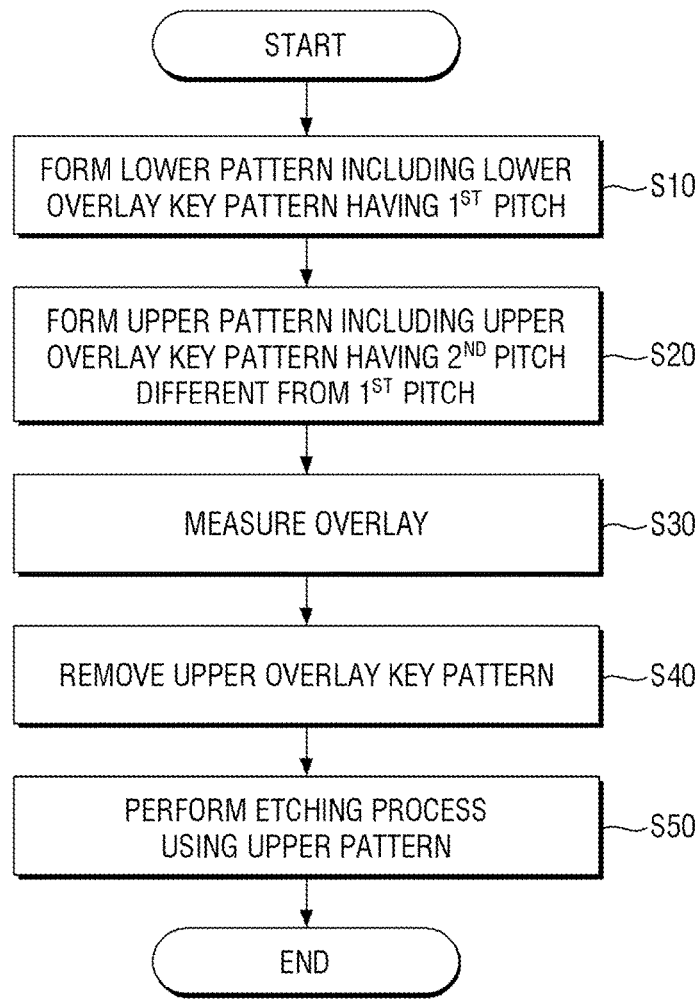
FIG. 3 is a flow chart for explaining a method for fabricating a semiconductor device according to some embodiments.

FIG. 3 is a flow chart for explaining a method for fabricating a semiconductor device according to some embodiments. FIGS. 4 to 9 are intermediate step diagrams for explaining the method for fabricating the semiconductor device according to some embodiments.

Figure 4:
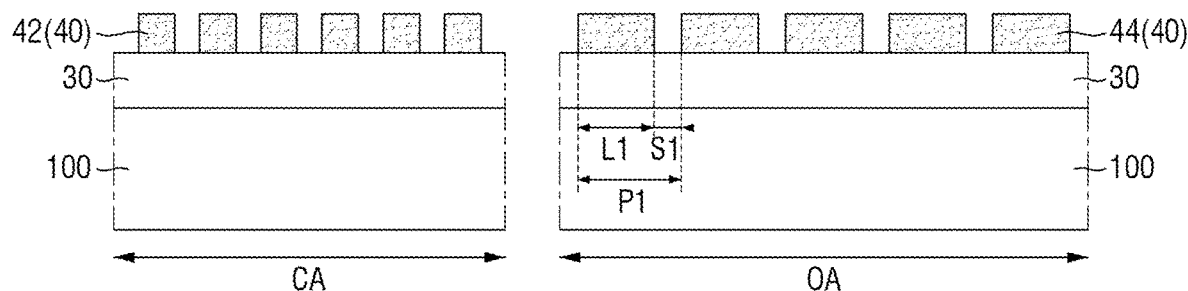
FIGS. 4 to 9 are intermediate step diagrams for explaining the method for fabricating the semiconductor device according to some embodiments.

Referring to FIGS. 3 and 4, a lower pattern 40 including a lower overlay key pattern 44 having a first pitch P1 may be formed (S10).

The substrate 100 may be provided. The lower pattern 40 may be formed on the substrate 100. The substrate 100 may be bulk silicon or silicon-on-insulator (SOI). The substrate 100 may be a silicon substrate, or may include other materials such as, for example, silicon germanium, gallium arsenide, silicon germanium on insulator (SGOI), indium antimonide, lead telluride, indium arsenide, indium phosphide, gallium arsenide or gallium antimonide. In some implementations, the substrate 100 may include an epitaxial layer formed on a base substrate, or the substrate 100 may be a ceramic substrate, a quartz substrate, a display glass substrate, or the like.

The substrate 100 may include a cell region CA and an overlay key region OA. Unit cell patterns (e.g., the lower cell pattern 42 and the upper cell pattern 62) for implementing a semiconductor device (e.g., a semiconductor memory device) may be formed on the cell region CA. The overlay key region OA may be placed near the cell region CA. Overlay key patterns (e.g., a lower overlay key pattern 44 and an upper overlay key pattern 64) corresponding to the unit cell patterns may be formed on the overlay key region OA.

The lower pattern 40 may include a lower cell pattern 42 on the cell region CA, and a lower overlay key pattern 44 on the overlay key region OA. The lower cell pattern 42 and the lower overlay key pattern 44 may be formed at the same level. Herein, the expression "formed at the same level" may refer to formation by a same fabricating process. In some embodiments, the lower cell pattern 42 and the lower overlay key pattern 44 may be placed at the same level. Herein, the expression "placed at the same level" may refer to placement at the same height on the basis of the substrate 100. Herein, the term "the same" may refer to not only exactly the same thing, but to items that exhibit minute differences that could occur due to process margins and the like.

The lower overlay key pattern 44 may have a first pitch P1. That is, the lower overlay key pattern 44 may include a plurality of first unit patterns spaced apart and periodically arranged at the first pitch P1. The first pitch P1 may be defined as the sum of a first line pitch L1 of each first unit pattern and a first spatial pitch S1 between adjacent first unit patterns. In some embodiments, the first pitch P1 of the lower overlay key pattern 44 may be greater than the pitch of the lower cell pattern 42.

Although the lower pattern 40 is only shown to be an embossed pattern, this is exemplary only. In some implementations the lower pattern 40 may be an engraved pattern. The lower pattern 40 may be made up of various materials for creating a semiconductor device. As an example, the lower pattern 40 may include conductive materials such as metal, metal nitride, metal silicide, and metal silicide nitride. As another example, the lower pattern 40 may include an insulating material such as silicon oxide, silicon nitride, and silicon oxynitride. As yet another example, the lower pattern 40 may include a semiconductor material such as polysilicon.

In some embodiments, the lower pattern 40 may be formed on the lower film 30, and the lower film 30 may be formed on the substrate 100. The lower film 30 may be made up of various materials for creating a semiconductor device, together with the lower pattern 40. As an example, the lower film 30 may include conductive materials such as metal, metal nitride, metal silicide, and metal silicide nitride. As another example, the lower film 30 may include an insulating material such as silicon oxide, silicon nitride, and silicon oxynitride. As yet another example, the lower film 30 may include a semiconductor material such as polysilicon. Although the lower film 30 is only shown to be a single film, this is exemplary only In some implementations, the lower film 30 may include multiple films formed of different materials from each other. In some other embodiments, the lower film 30 may be omitted.

Figure 5:
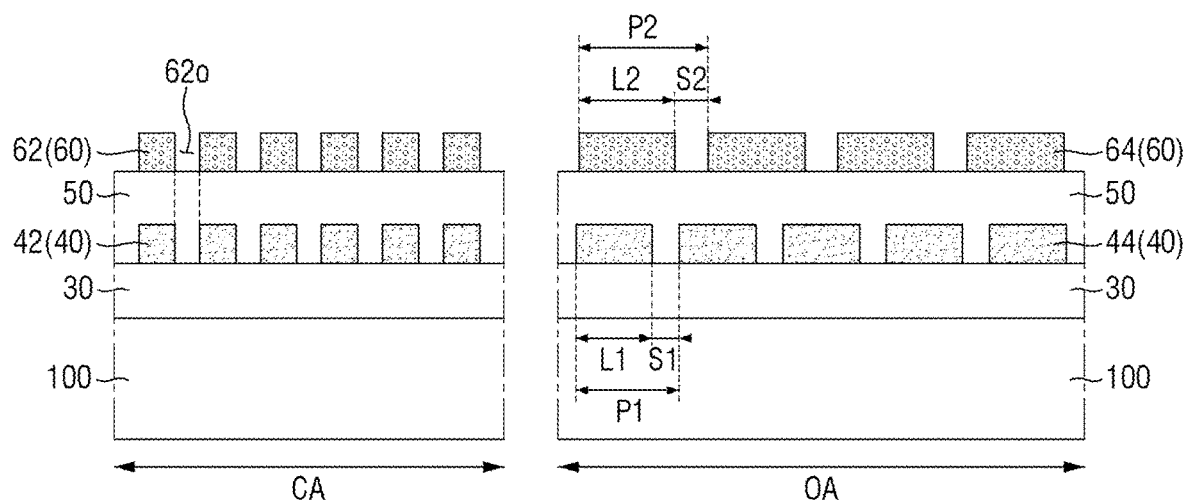

Referring to FIGS. 3 and 5, an upper pattern 60 including an upper overlay key pattern 64 having a second pitch P2 different from the first pitch P1 may be formed (S20).

For example, the upper film 50 may be formed on the substrate 100 and the lower pattern 40. The upper pattern 60 may be formed on the upper film 50. The upper film 50 may be formed at a thickness thicker than the lower pattern 40 to cover the lower pattern 40. Also, the upper face of the upper film 50 may be flat. In some embodiments, the upper film 50 may include a transparent film through which the lower pattern 40 penetrates. For example, the upper film 50 may include, silicon oxide or silicon nitride, as non-limiting examples. Although the upper film 50 is only shown to be a single film, in some implementations, the upper film 50 may include multi-films formed of different materials from each other.

The upper pattern 60 may include an upper cell pattern 62 on the cell region CA, and an upper overlay key pattern 64 on the overlay key region OA. The upper cell pattern 62 and the upper overlay key pattern 64 may be formed at the same level. In some embodiments, the upper cell pattern 62 and the upper overlay key pattern 64 may be located at the same level.

The upper cell pattern 62 may be aligned with respect to the lower cell pattern 42. Although the upper cell pattern 62 is only shown to completely overlap the lower cell pattern 42 in the vertical direction, this is exemplary only. As another example, unlike the shown example, at least a part of the upper cell pattern 62 may not overlap the lower cell pattern 42 in the vertical direction. In some embodiments, unlike the shown example, the width of the upper cell pattern 62 may differ from the width of the lower cell pattern 42, or the pitch of the upper cell pattern 62 may differ from the pitch of the lower cell pattern 42.

The upper overlay key pattern 64 may have a second pitch P2. That is, the upper overlay key pattern 64 may include a plurality of second unit patterns spaced apart and periodically arranged at the second pitch P2. The second pitch P2 may be defined as the sum of a second line pitch L2 of each second unit pattern and a second spatial pitch S2 between adjacent second unit patterns. In some embodiments, the second pitch P2 of the upper overlay key pattern 64 may be greater than the pitch of the upper cell pattern 62.

In some embodiments, the upper pattern 60 may include a photosensitive photoresist. For example, a photoresist film may be applied onto the upper film 50 by an application process such as a spin coating process, a dip coating process or a spray coating process. The upper pattern 60 may be a photoresist pattern formed by performing an exposure process and a development process on a photoresist film.

In some embodiments, the upper pattern 60 may include, but is not limited to, a photoresist for an extreme ultraviolet (EUV) laser (about 13.5 nm), a photoresist for a KrF excimer laser (about 248 nm), photoresist for an ArF excimer laser (about 193 nm) or a photoresist for an $F_2$ excimer laser (about 157 nm).

In some embodiments, the upper pattern 60 may include a photoresist for extreme ultraviolet (EUV). As an example, the upper pattern 60 may be an organic photoresist including an organic polymer such as polyhydroxystyrene. The organic photoresist may further include a material with high EUV absorption, for example, an organometallic material, an iodine-containing material or a fluorine-containing material. As another example, the upper pattern 60 may be an inorganic photoresist that contains an inorganic material such as tin oxide.

The second pitch P2 of the upper overlay key pattern 64 may be different from the first pitch P1 of the lower overlay key pattern 44. As an example, the second pitch P2 may be greater than the first pitch P1. In some implementations, the second pitch P2 may be smaller than the first pitch P1, unlike the shown example. As long as the first pitch P1 and the second pitch P2 differ from each other, the first line pitch L1 and the second line pitch L2 may be identical to each other, or the first spatial pitch S1 and the second spatial pitch S2 may be identical to each other. As an example, the first line pitch L1 and the second line pitch L2 may be identical to each other, and the first spatial pitch S1 and the second spatial pitch S2 may be different from each other. As another example, the first line pitch L1 and the second line pitch L2 may be different from each other, and the first spatial pitch S1 and the second spatial pitch S2 may be identical to each other.

Figure 6:
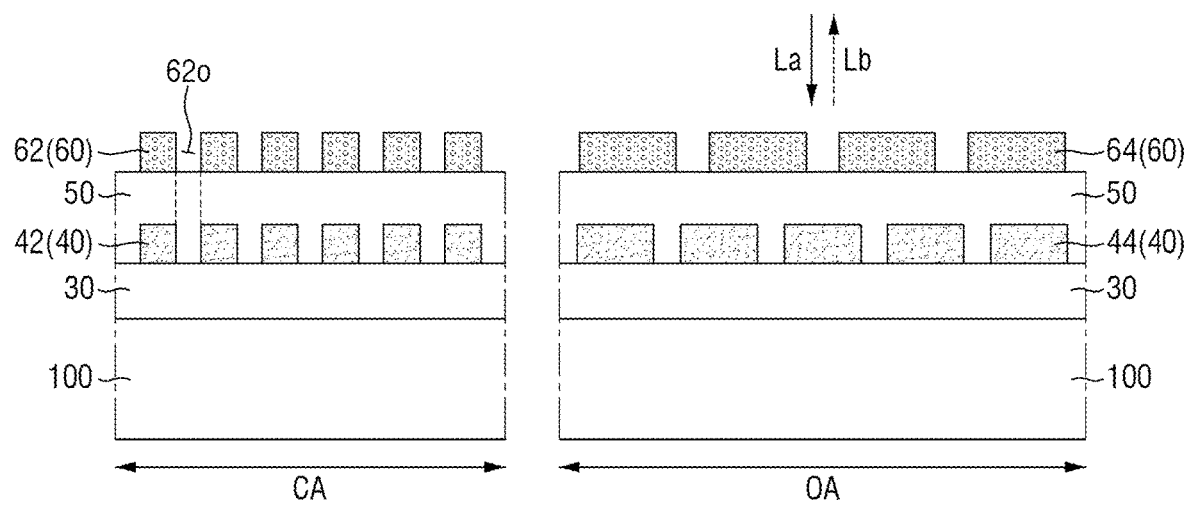

Referring to FIGS. 3 and 6, an overlay between the lower pattern 40 and the upper pattern 60 may be measured (S30).

For example, by irradiating the measured light La toward the lower overlay key pattern 44 and the upper overlay key pattern 64, and by acquiring the reflected light Lb reflected from the lower overlay key pattern 44 and the upper overlay key pattern 64, using the overlay error detection device 1 described above using FIGS. 1 and 3, the overlay error between the lower overlay key pattern 44 and the upper overlay key pattern 64 may be measured.

In some embodiments, the overlay between the lower pattern 40 and the upper pattern 60 may be measured using a Moire effect. Specifically, the first pitch P1 and the second pitch P2 may differ from each other, and an image acquired from the reflected light Lb may include a Moire pattern. A period or a pitch of the Moire pattern (hereinafter a Moire pitch $P_M$) may generally be greater than each of the first pitch P1 and the second pitch P2, and may be related to a difference between the first pitch P1 and the second pitch P2. More specifically, the Moire pitch PM may be defined by the following Formula 1.

$$P_w = \frac{P_1 \cdot P_2}{|P_1 - P_2|} \quad \text{[Formula 1]}$$

When using such a Moire pattern, a more accurate overlay measurement may be enabled. Specifically, a physical shift (hereinafter referred to as an overlay error) of the upper overlay key pattern 64 relative to the lower overlay key pattern 44 may cause a shift of the Moire pattern. The shift of the Moire pattern may generally be greater than the overlay error and proportional to the overlay error. More specifically, the shift of the Moire pattern may be magnified by a magnification (hereinafter referred to as a Moire factor $P_F$) defined by Formula (2) below.

$$P_p = \frac{P_1}{|P_1 - P_2|} \quad \text{[Formula 2]}$$

Accordingly, a more accurate overlay measurement may be enabled, and the upper cell pattern 62 may be aligned with the lower cell pattern 42 with a high level of accuracy.

In some embodiments, a difference between the first pitch P1 and the second pitch P2 may be about 100 nm to about 300 nm. Within the above range, it is possible to provide a sufficient resolution to an image sensor (e.g., 14 of FIG. 2) that captures the Moire pattern, and to easily measure the captured Moire pattern.

In some embodiments, when the upper pattern 60 includes a photoresist, measurement of the overlay between the lower pattern 40 and the upper pattern 60 may include a performance of an ADT (after development inspection).

Figure 7:
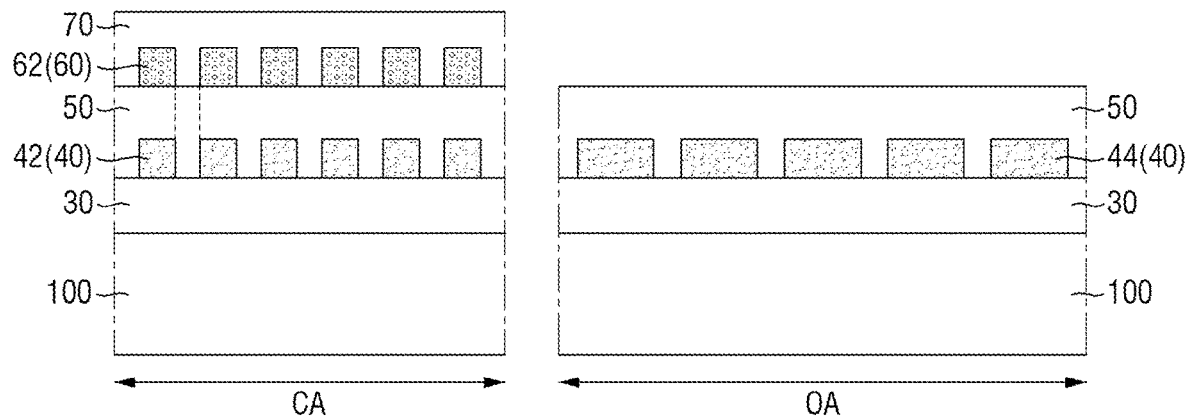

Referring to FIGS. 3 and 7, the upper overlay key pattern 64 may be removed (S40).

The upper overlay key pattern 64 may be selectively removed with respect to the upper cell pattern 62. For example, a mask film 70 that covers the cell region CA and exposes the overlay key region OA may be formed. The upper overlay key pattern 64 exposed by the mask film 70 may then be removed. After the upper overlay key pattern 64 is removed, the mask film 70 may be removed.

Figure 8:
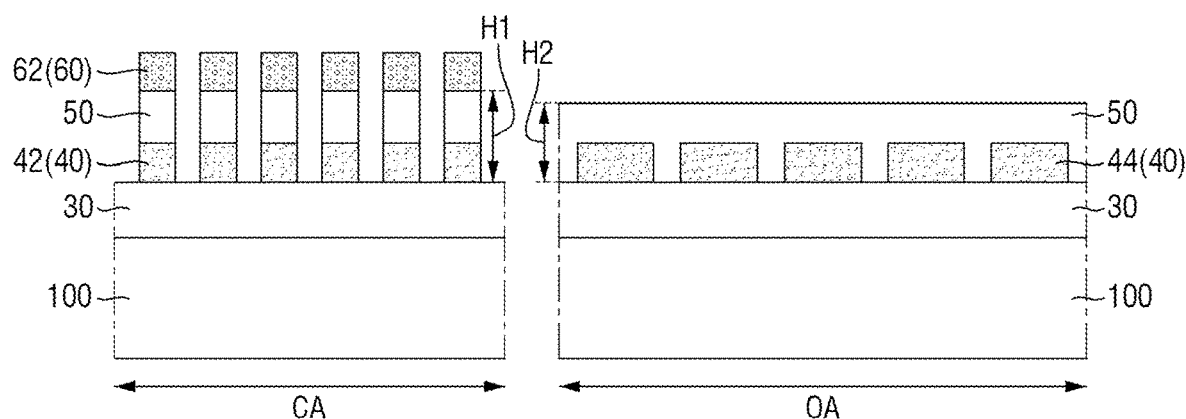

Referring to FIGS. 3 and 8, an etching process may be performed using the upper pattern 60 (S50).

The etching process may use the upper pattern 60 as an etching mask. For example, an etching process that uses the upper cell pattern 62 including a photoresist as an etch mask may be performed. Accordingly, the etching process may be performed on the upper film 50 on the cell region CA. For example, a part of the upper film 50 on the cell region CA exposed by an opening 62o of the upper cell pattern 62 may be removed.

In some embodiments, an etch endpoint of the etching process may be lower than the upper face of the lower cell pattern 42. For example, as shown, the lower film 30 on the cell region CA may be exposed as the etching process is performed. In some alternate implementations the upper film 50 on the cell region CA exposed by the opening 62o may not be completely removed. In some implementations, as the etching process is performed, a part of the lower film 30 on the cell region CA that overlaps the opening 62o in the vertical direction may be removed to expose the substrate 100 on the cell region CA.

In some implementations, when the upper overlay key pattern 64 is removed as described above with respect to FIG. 7, the etching process on the overlay key region OA may be restricted. Specifically, etching conditions for the overlay key region OA from which the upper overlay key pattern 64 is removed may differ from etching conditions for the cell region CA having the opening 62o of a predetermined size. For example, when the etching process targets the cell region CA, the etching conditions of the etching process (e.g., an etching time, an etching temperature, an etchant concentration, and the like) of the etching process may be set to be suitable for (to correspond to) the upper cell pattern 62 having the opening 62o of a predetermined size. Accordingly, even after the etching process is completed, the upper film 50 on the overlay key region OA may not be etched or may be hardly etched. Also, even if the etch endpoint of the etching process is lower than the upper face of the lower cell pattern 42, the lower overlay key pattern 44 on the overlay key region OA may not be etched by the etching process.

Herein, an example in which only the upper cell pattern 62 remains after performing the etching process is shown as a non-limiting example. Unlike the shown example, after the etching process is completed, a part of the upper cell pattern 62 may be removed, and the upper cell pattern 62 may be completely removed to expose the upper face of the upper film 50.

In some embodiments, a height H2 of the upper face of the upper film 50 on the overlay key region OA may be lower than or identical to a height H1 of the upper face of the upper film 50 on the cell region CA after the etching process is completed.

Figure 9:
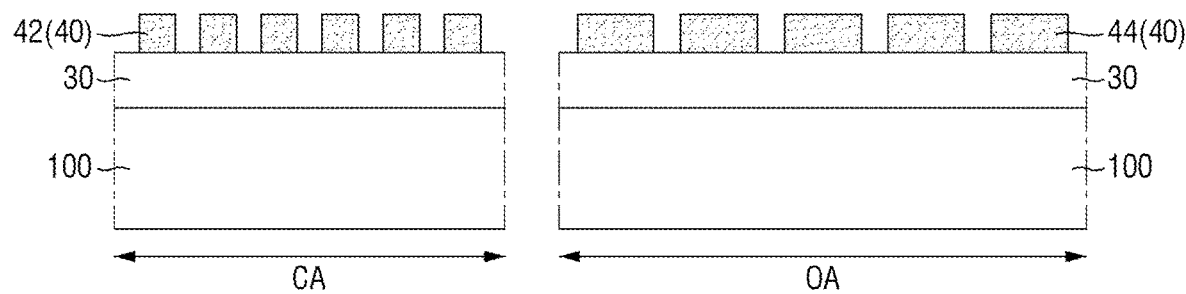

Next, referring to FIG. 9, the upper cell pattern 62 and/or the upper film 50 may be removed.

For example, a cleaning process for removing the upper cell pattern 62 and/or the upper film 50 may be performed. Accordingly, an etching process using the precisely aligned upper cell patterns 62 may be performed.

Figure 10:
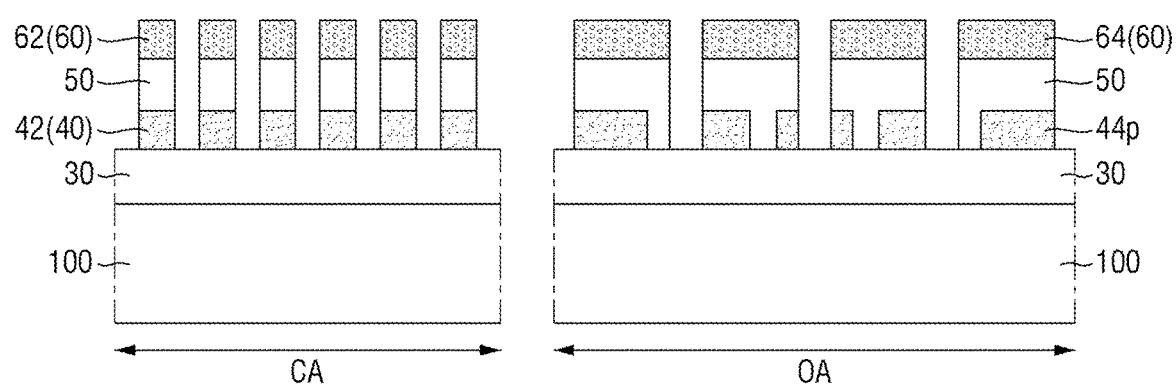
FIGS. 10 and 11 are intermediate step diagrams for explaining the effects of the method for fabricating the semiconductor device according to some embodiments.
Figure 11:
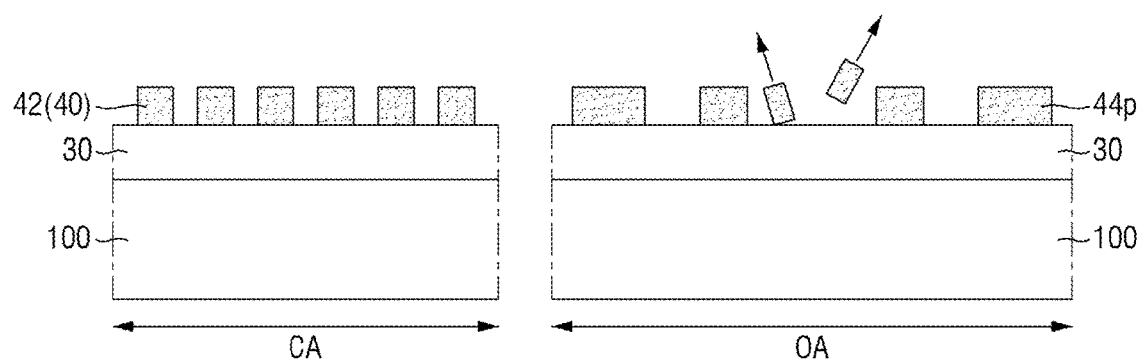

FIGS. 10 and 11 are intermediate step diagrams for explaining the effects of the method for fabricating the semiconductor device according to some embodiments. For reference, FIG. 10 is an intermediate step diagram for explaining a step occurring after the steps leading to FIG. 5.

Referring to FIG. 10, an etching process may be performed using an upper pattern 60 that includes the upper overlay key pattern 64, using an etching process for fabricating the semiconductor device that differs from some other embodiments.

Unlike the processes explained above with respect to FIGS. 3 and 8, the etching process for the overlay key region OA may not be limited. Specifically, similarly to the upper cell pattern 62, as the upper overlay key pattern 64 may also have an opening of a predetermined size. The upper film 50 on the overlay key region OA may be etched at a level similar to that of the upper film 50 on the cell region CA.

When the etch endpoint of the etching process is lower than the upper face of the lower cell pattern 42, there is a risk that a part of the lower overlay key pattern 44 on the overlay key region OA could be damaged by the etching process. For example, a part of the lower overlay key pattern 44 on the overlay key region OA may be etched by the etching process to form a patterned overlay key pattern 44p. At this time, the patterned overlay key pattern 44p might be unevenly formed due to the fact that the first pitch P1 of the lower overlay key pattern 44 and the second pitch P2 of the upper overlay key pattern 64 may differ from each other. Further, the patterned overlay key pattern 44p may include patterns with excessively small critical dimensions (CD).

Referring to FIG. 11, the upper cell pattern 62 and/or the upper film 50 may be removed. Since the removal of the upper cell pattern 62 and/or the upper film 50 is similar to that described above with regard to FIG. 9, detailed descriptions thereof will not be repeated below.

When the upper cell pattern 62 and/or the upper film 50 is removed, the patterned overlay key pattern 44p might be exposed and defects might be created in subsequent processes. For example, as shown, patterns with excessively small critical dimensions in the patterned overlay key pattern 44p might break away from the substrate 100 and/or the lower film 30 to cause pattern defects. Such an issue may create a limitation on the overlay measurement process based on the Moire effect in the method of fabricating the semiconductor device for forming the fine cell patterns.

In some implementations, as described above with regard to FIGS. 3 to 9, the method for fabricating the semiconductor device according to some embodiments includes performing (S50) of an etching process using the upper pattern 60 after removing the upper overlay key pattern 64 (S40). As a result, damage of the lower overlay key pattern 44 that could be caused by the upper overlay key pattern 64 may be prevented, and the method for fabricating the semiconductor device using an overlay measurement process based on the Moire effect may be provided.

Figure 12:
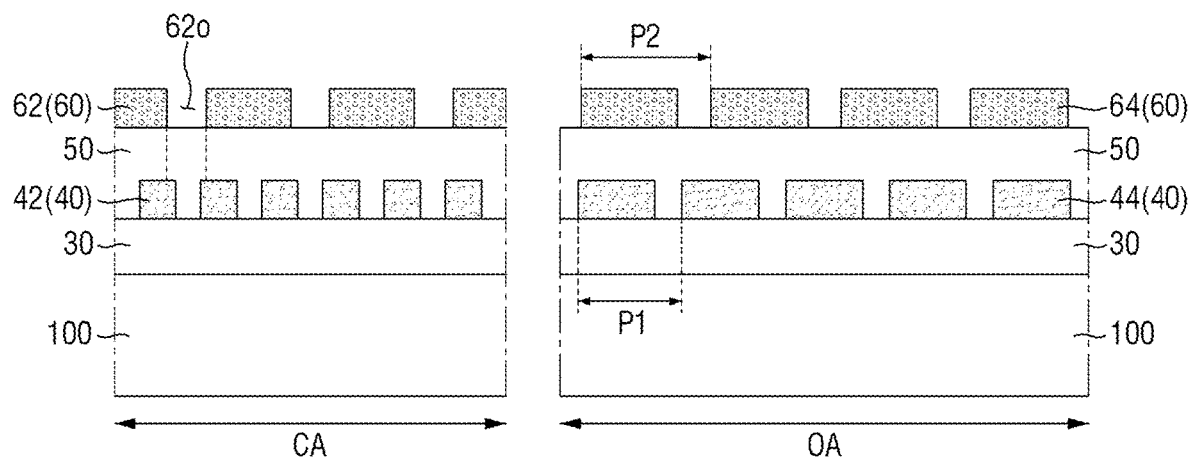
FIGS. 12 to 15 are intermediate step diagrams for explaining the method for fabricating the semiconductor device according to some embodiments.

FIGS. 12 to 15 are intermediate step diagrams for explaining the method for fabricating a semiconductor device according to some embodiments. For convenience of explanation, repeated parts of those explained above using FIGS. 1 to 11 will be briefly explained or not repeated. For reference, FIG. 12 is an intermediate step diagram for explaining a step occurring after the step leading to FIG. 4.

Referring to FIG. 12, the upper pattern 60 including the upper cell pattern 62 on the cell region CA and the upper overlay key pattern 64 on the overlay key region OA may be formed.

The upper cell pattern 62 may be aligned with the lower cell pattern 42. In some embodiments, the upper cell pattern 62 may not completely overlap the lower cell pattern 42 in the vertical direction. For example, the opening 62o of the upper cell pattern 62 may overlap a part of the lower cell pattern 42 in the vertical direction. Alternatively, as shown, the width of the upper cell pattern 62 may differ from the width of the lower cell pattern 42, or the pitch of the upper cell pattern 62 may differ from the pitch of the lower cell pattern 42.

The second pitch P2 of the upper overlay key pattern 64 may differ from the first pitch P1 of the lower overlay key pattern 44.

Next, the overlay between the lower pattern 40 and the upper pattern 60 may be measured. Measurement of the overlay between the lower pattern 40 and the upper pattern 60 is similar to that explained above using FIGS. 3 and 6, and therefore will not be described in detail below.

Figure 13:
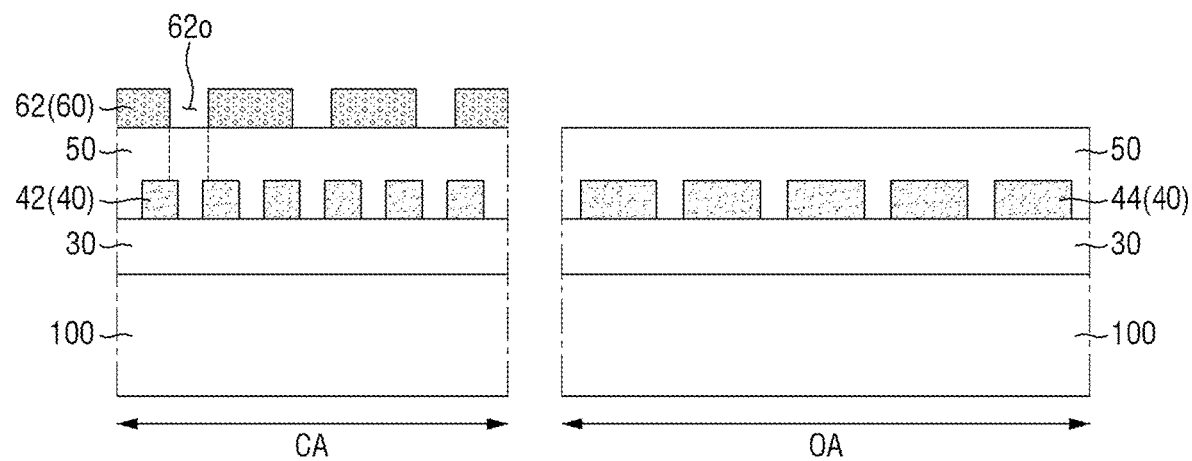

Referring to FIG. 13, the upper overlay key pattern 64 may be removed. The removal of the upper overlay key pattern 64 may be similar to the process explained above using FIGS. 3 and 7, and therefore a description thereof will not be repeated or described in detail below.

Figure 14:
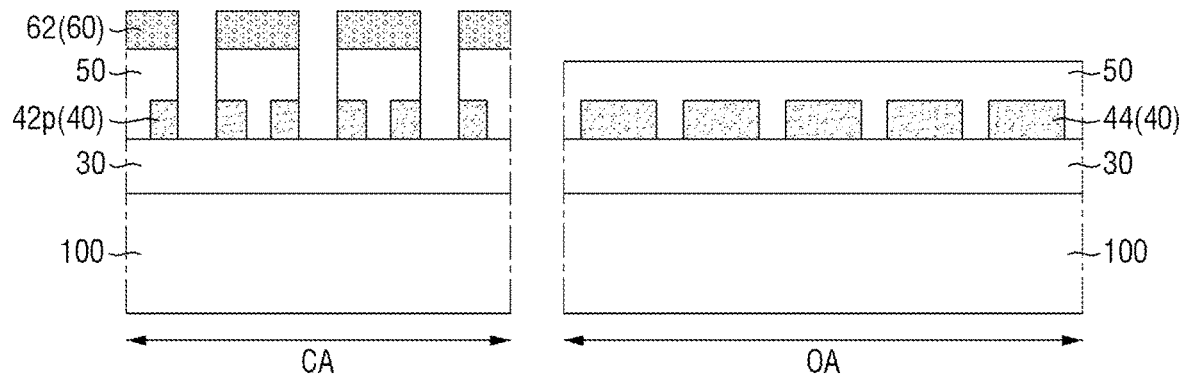

Referring to FIG. 14, the etching process may be performed using the upper pattern 60.

The etching process may use the upper pattern 60 as an etching mask. As a result, a part of the upper film 50 on the cell region CA exposed by the opening 62o of the upper cell pattern 62 may be removed.

In some embodiments, the etch endpoint of the etch process may be lower than the upper face of the lower cell pattern 42. In this case, a part of the lower cell pattern 42 that overlaps the opening 62o of the upper cell pattern 62 in the vertical direction may be etched to form a target cell pattern 42p.

Alternately, as explained above with regard to FIGS. 3 and 8, the etching process for the overlay key region OA may be limited. Therefore, the lower overlay key pattern 44 on the overlay key region OA might not be damaged by the etching process.

Figure 15:
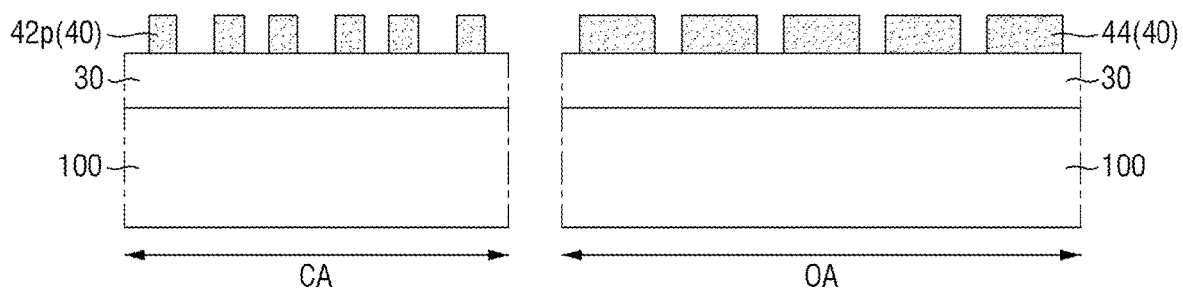

Referring to FIG. 15, the upper cell pattern 62 and/or the upper film 50 may be removed. The removal of the upper cell pattern 62 and/or the upper film 50 may be similar to the process explained above with regard to FIG. 9. Therefore, detailed descriptions thereof will not be repeated below. Accordingly, the target cell pattern 42p may be formed using the precisely aligned upper cell pattern 62.

Figure 16:
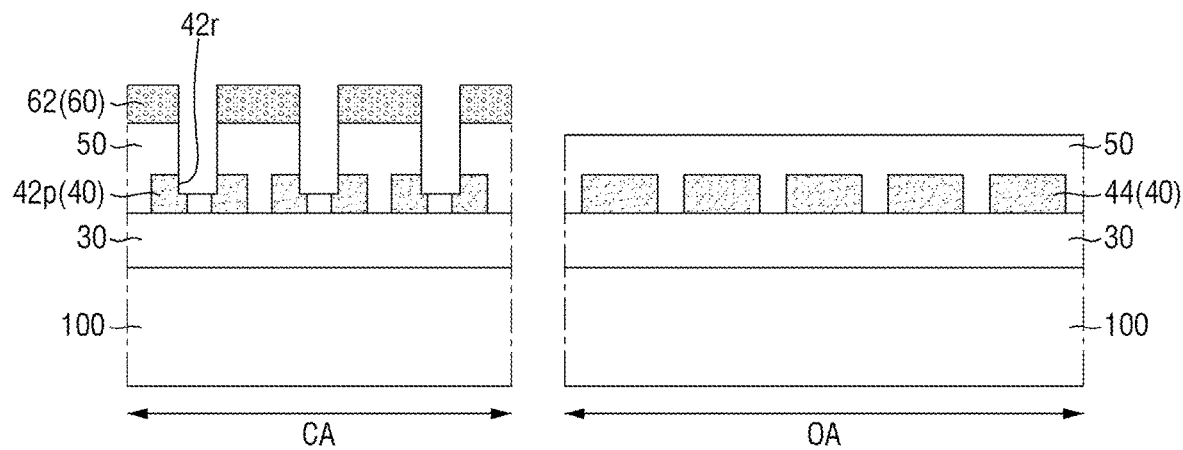
FIGS. 16 and 17 are intermediate step diagrams for describing the method for fabricating the semiconductor device according to some embodiments.
Figure 17:
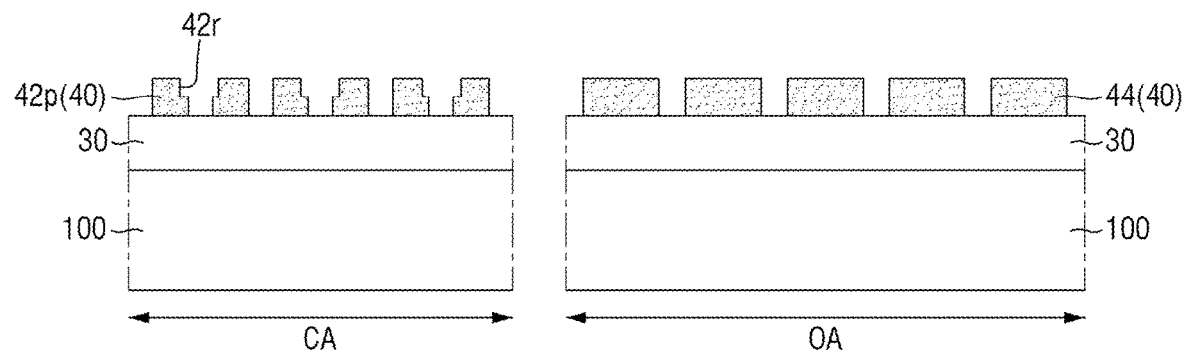

FIGS. 16 and 17 are intermediate step diagrams for describing a method for fabricating the semiconductor device according to some embodiments. For convenience of explanation, repeated parts of those explained above using FIGS. 1 to 15 will be briefly explained or not repeated. For reference, FIG. 16 is an intermediate step diagram for explaining a step after FIG. 13.

Referring to FIG. 16, the etching process may be performed using the upper pattern 60.

In some embodiments, the etch endpoint of the etching process may be lower than the upper face of the lower cell pattern 42 and higher than the lower face of the lower cell pattern 42. In this case, a part of the lower cell pattern 42 that overlaps the opening 62o of the upper cell pattern 62 in the vertical direction may be etched to form the target cell pattern 42p.

In some embodiments, the target cell pattern 42p may include a first recess 42r formed by the etching process. The first recess 42r may be formed by removing the upper part of the lower cell pattern 42.

Referring to FIG. 17, the upper cell pattern 62 and/or the upper film 50 may be removed. The removal of the upper cell pattern 62 and/or the upper film 50 is similar to that explained above using FIG. 9, and therefore, detailed descriptions thereof will not be repeated below. Accordingly, the target cell pattern 42p including the first recess 42r may be formed using the precisely aligned upper cell pattern 62.

Figure 18:
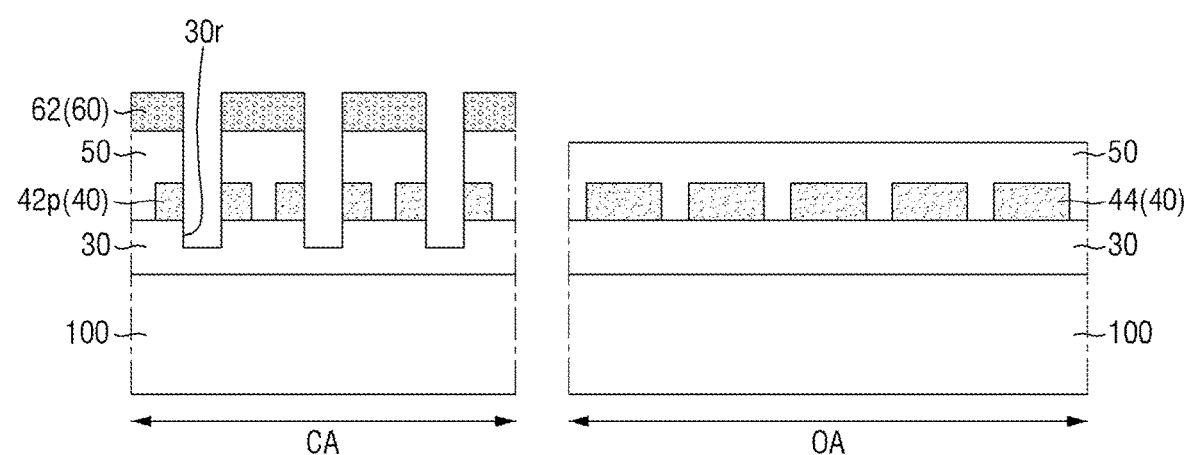
FIGS. 18 and 19 are intermediate step diagrams for explaining a method for fabricating a semiconductor device according to some embodiments.
Figure 19:
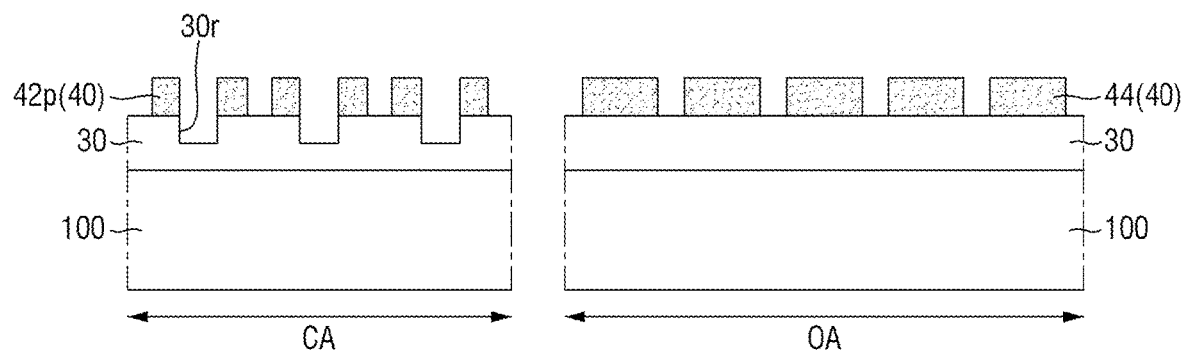

FIGS. 18 and 19 are intermediate step diagrams for explaining a method for fabricating a semiconductor device according to some embodiments. For convenience of explanation, repeated parts of those explained above using FIGS. 1 to 15 will be briefly explained or not repeated. For reference, FIG. 18 is an intermediate step diagram for explaining a step after the steps leading to FIG. 13.

Referring to FIG. 18, the etching process may be performed using the upper pattern 60.

In some embodiments, the etch endpoint of the etch process may be lower than the upper face of the lower film 30. In this case, a part of the lower film 30 that overlaps the opening 62o of the upper cell pattern 62 in the vertical direction may be etched.

In some embodiments, the lower film 30 may include a second recess 30r formed by the etching process. The second recess 30r may be formed by removing the upper part of the lower film 30.

Referring to FIG. 19, the upper cell pattern 62 and/or the upper film 50 is removed. The removal of the upper cell pattern 62 and/or the upper film 50 is similar to that explained above using FIG. 9, and therefore, detailed descriptions thereof will not be repeated below. Accordingly, the target cell pattern 42p and the second recess 30r may be formed using the precisely aligned upper cell pattern 62.

Figure 20:
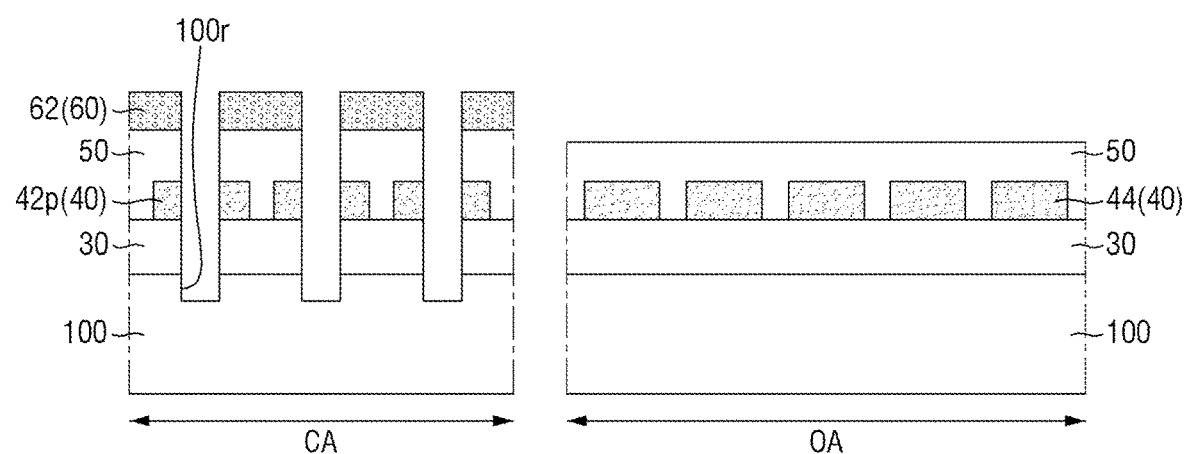
FIGS. 20 and 21 are intermediate step diagrams for explaining a method for fabricating a semiconductor device according to some embodiments.
Figure 21:
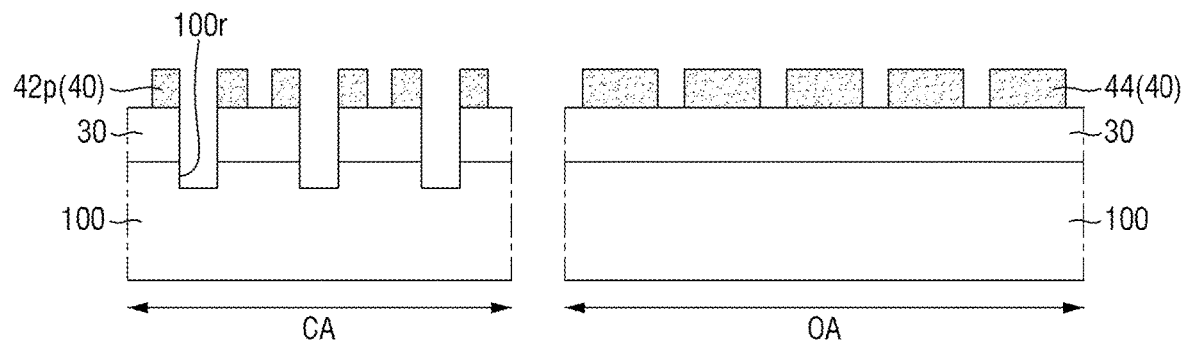

FIGS. 20 and 21 are intermediate step diagrams for explaining a method for fabricating a semiconductor device according to some embodiments. For convenience of explanation, repeated parts of those explained above using FIGS. 1 to 15 will be briefly explained or not further repeated. For reference, FIG. 20 is an intermediate step drawing for explaining a step after the steps leading to FIG. 13.

Referring to FIG. 20, the etching process may be performed using the upper pattern 60.

In some embodiments, the etch endpoint of the etching process may be lower than the upper face of the substrate 100. In this case, a part of the substrate 100 that overlaps the opening 62o of the upper cell pattern 62 in the vertical direction may be etched.

In some embodiments, the substrate 100 may include a third recess 100r formed by the etching process. The third recess 100r may be formed by removing the upper part of the substrate 100.

Referring to FIG. 21, the upper cell pattern 62 and/or the upper film 50 may be removed. The removal of the upper cell pattern 62 and/or the upper film 50 may be similar to that explained above using FIG. 9, and therefore, detailed descriptions thereof will not be repeated below. Accordingly, the target cell pattern 42p and the third recess 100r may be formed using the precisely aligned upper cell pattern 62.

The method for fabricating the semiconductor device according to exemplary embodiments will be described below with reference to FIGS. 1 to 37. Although FIGS. 23 to 37 show a DRAM (Dynamic Random-Access Memory) as an example of the semiconductor device, this is merely an example. Those who have ordinary knowledge in the technical field to which the present invention pertains will appreciate that the technical idea of the present invention may also be implemented on various other semiconductor devices fabricated using the overlay measurement process, for example, a system LSI (large scale integration), a flash memory, an SRAM, an EEPROM, a PRAM, a MRAM or a RERAM, an image sensor such as a CIS (CMOS imaging sensor), a MEMS (micro-electro-mechanical systems), an active element, a passive element, and the like.

Figure 22:
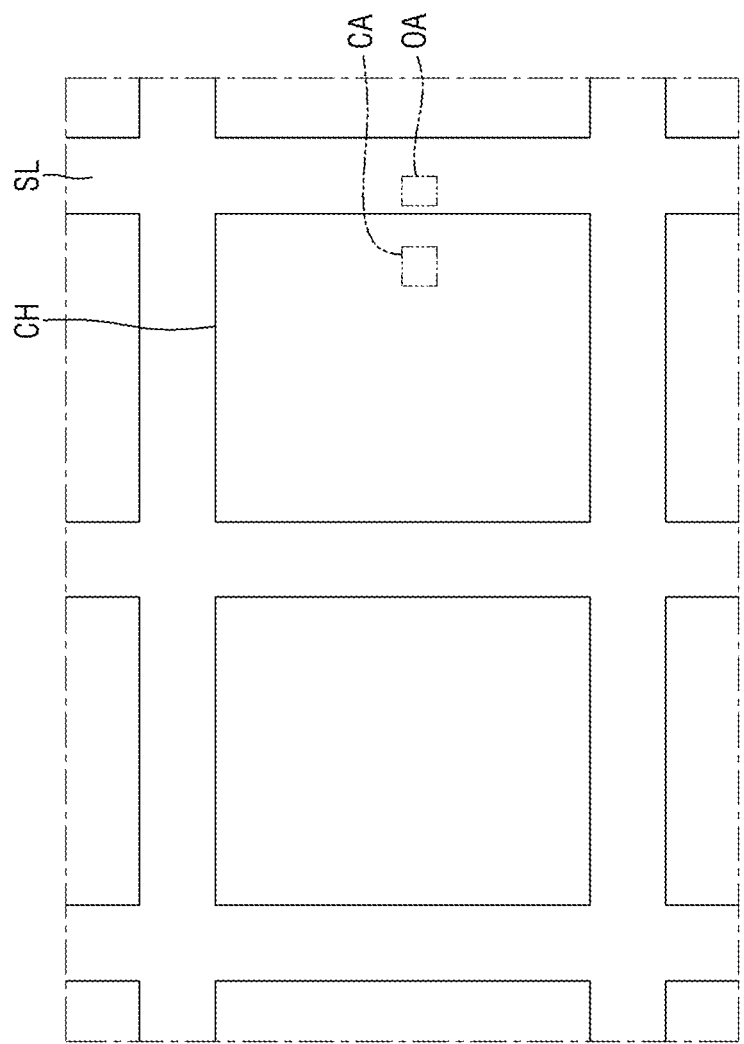
FIG. 22 is a layout diagram for explaining the method for fabricating the semiconductor device according to some embodiments.

FIG. 22 is a layout diagram for explaining the method for fabricating the semiconductor device according to some embodiments. FIGS. 23 to 37 are intermediate step diagrams for explaining the method for fabricating the semiconductor device according to some embodiments. For convenience of explanation, repeated parts of those explained above using FIGS. 1 to 21 will be briefly explained and not repeated.

Referring to FIG. 22, the semiconductor device according to some embodiments may include a plurality of chip regions CH and a scribe lane region SL.

The plurality of chip regions CH may be arranged two-dimensionally. A cell region CA may be placed in each chip region CH. The scribe lane region SL may be located between the chip regions CH. Each chip region CH may be defined by the scribe lane region SL. For example, the scribe lane region SL may surround each chip region CH. After the semiconductor process for forming the chip regions CH is completed, the scribe lane region SL may be cut to provide chip regions CH that are separated from each other.

In some embodiments, the overlay key region OA may be placed inside the scribe lane region SL. However, the technical idea of the present disclosure is not limited thereto. In some implementations, the overlay key region OA may be placed inside the chip region CH. In the following description, the overlay key region OA will be exemplified as being placed inside the scribe lane region SL.

Figure 23:
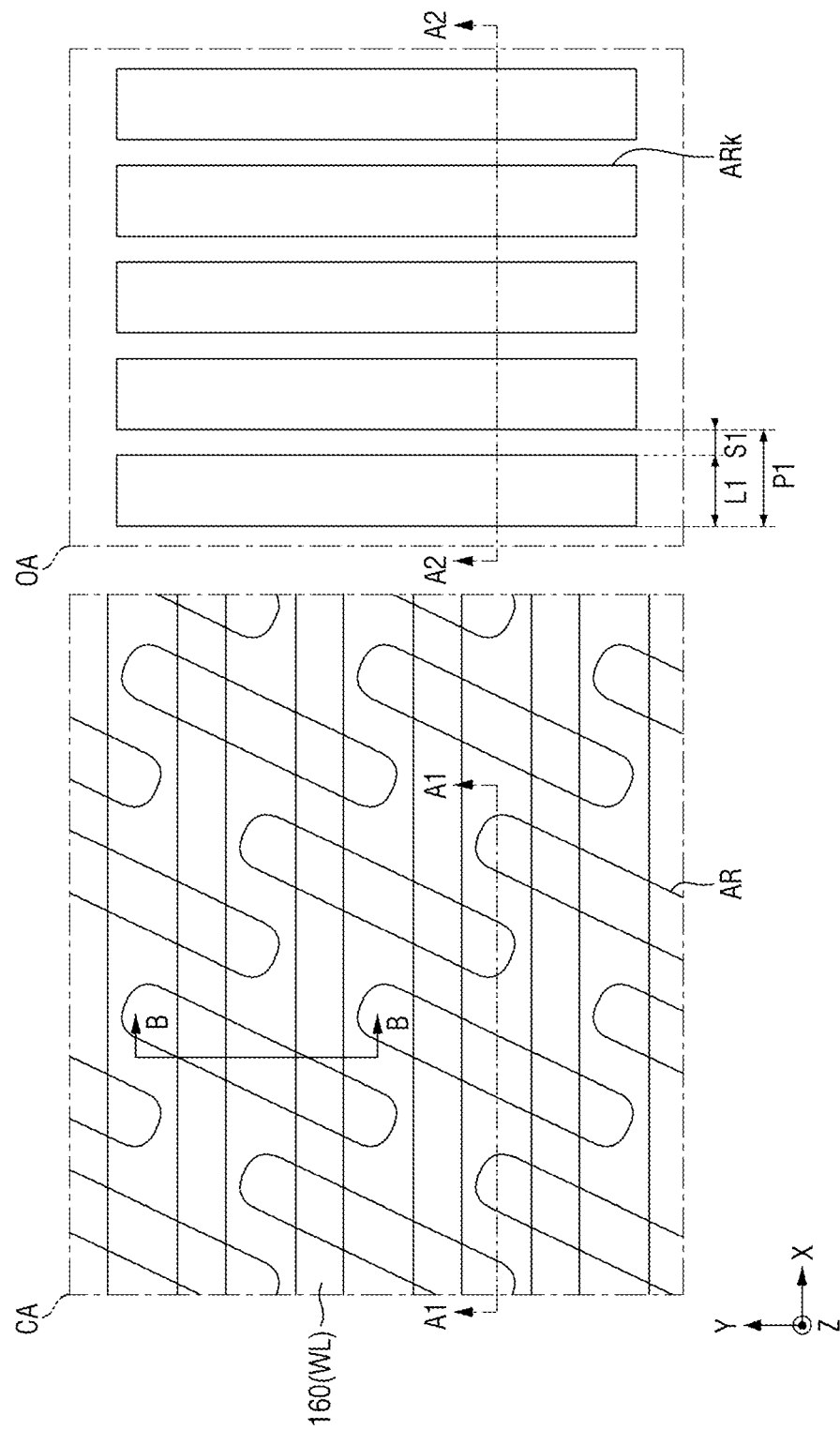
FIGS. 23 to 37 are intermediate step diagrams for explaining the method for fabricating the semiconductor device according to some embodiments.
Figure 24:
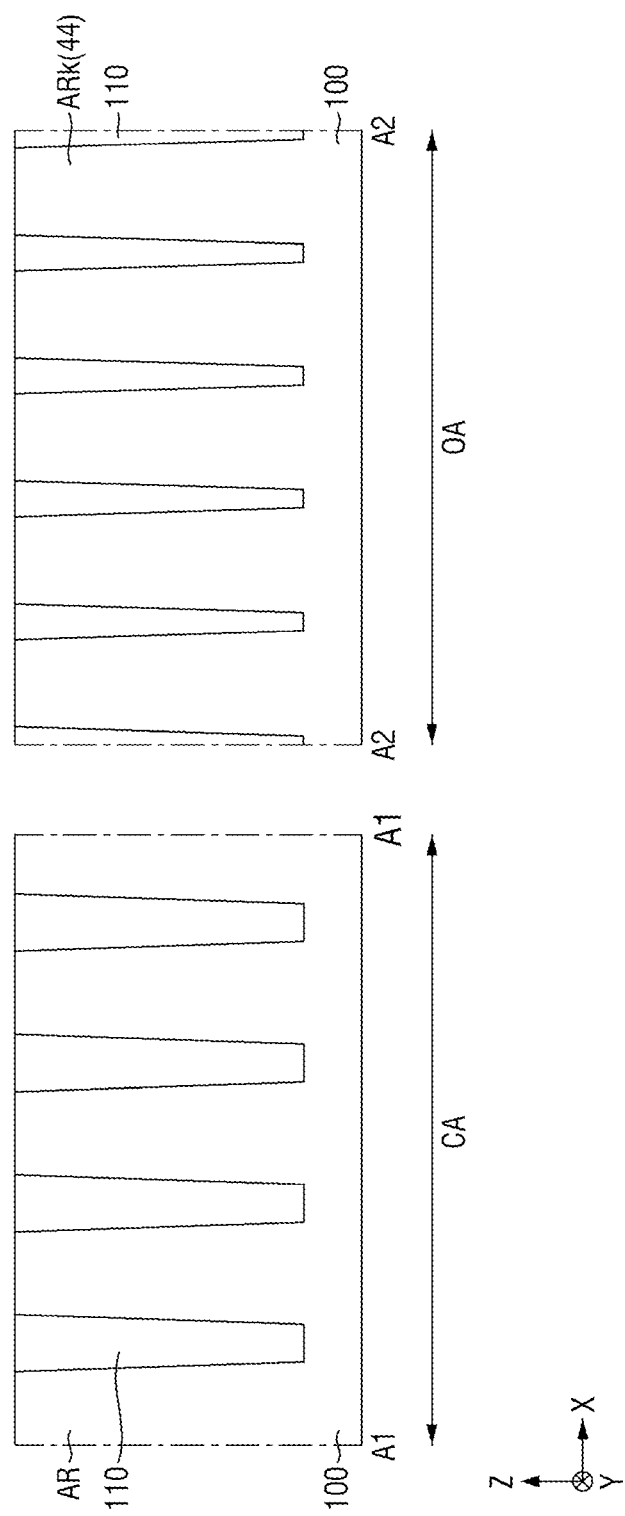
Figure 25:
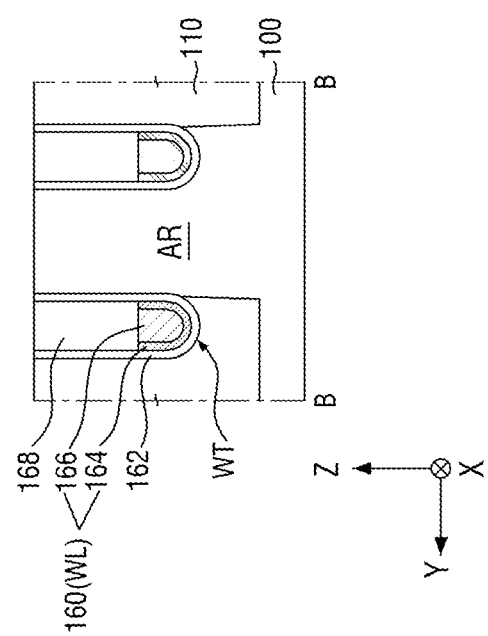

Referring to FIGS. 23 to 25, an active region AR and word lines WL may be formed on the cell region CA, and a first overlay key pattern ARk may be formed on the overlay key region OA. For reference, FIG. 24 is a cross-sectional view taken along A1-A1 and A2-A2 of FIG. 23, and FIG. 25 is a cross-sectional view taken along B-B of FIG. 23.

The active region AR and the first overlay key pattern ARk may be formed on the substrate 100. The active region AR and the first overlay key pattern ARk may be formed by etching a part of the substrate 100 or may be an epitaxial layer that is grown from the substrate 100.

The active region AR may be in the form of a plurality of bars extending in directions parallel to each other. Furthermore, the center of one of the plurality of active regions AR may be placed adjacent to the distal end portion of another active region AR. In some embodiments, the active region AR may be in a form of a diagonal bar. For example, as shown in FIG. 23, the active region AR may be in a form of a diagonal bar that extends in a direction (hereinafter, a fourth direction) different from the first direction X and the second direction Y in a plane (XY plane) including the first direction X and the second direction Y. The active region AR may be provided as a source/drain region by including impurities.

The first overlay key pattern ARK may be formed at the same level as the active region AR. The first overlay key pattern ARk may have a first pitch P1. For example, the first overlay key pattern ARk may include a plurality of first unit patterns spaced apart and periodically arranged at the first pitch P1. The first pitch P1 may be defined as the sum of a first line pitch L1 of each first unit pattern and a first spatial pitch S1 between adjacent first unit patterns. In some embodiments, the plurality of first unit patterns may extend side by side in the second direction Y. Although not specifically shown, the plurality of first unit patterns may be arranged rotationally symmetrically to form the first overlay key pattern ARk.

In some embodiments, an element isolation film 110 may be formed inside the substrate 100. The element isolation film 110 may define the active regions AR and the first overlay key pattern ARk inside the substrate 100. Although FIGS. 24 and 25 show that side faces of the element isolation film 110 have inclinations, this is merely a feature of the process, and embodiments are not limited thereto.

The element isolation film 110 may include, for example, at least one of silicon oxide, silicon nitride, and combinations thereof. The element isolation film 110 may be a single film made up of one type of insulating material, or may be a multi-film made of a combination of various types of insulating materials.

The word lines WL may extend long in the first direction X across the active region AR. For example, the word line WL may diagonally cross the active region AR. The word line WL may be interposed between a direct contact DC and a buried contact BC, as will be described below. A plurality of word lines WL may extend parallel to each other. For example, a plurality of word lines WL spaced apart at regular intervals and extending in the first direction X may be formed.

The word line WL may include a first conductive pattern 160. The first conductive pattern 160 may be a single film, or may be a multi-film as shown, for example, in FIG. 25. For example, the first conductive pattern 160 may include a first sub-conductive pattern 164 and a second sub-conductive pattern 166 that are sequentially stacked on the substrate 100. The first sub-conductive pattern 164 and the second sub-conductive pattern 166 may each include, as a non-limiting example, at least one of metal, polysilicon, and combinations thereof.

A word line dielectric film 162 may be interposed between the first conductive pattern 160 and the substrate 100. The word line dielectric film 162 may include, as a non-limiting example, at least one of silicon oxide, silicon oxynitride, silicon nitride, and a high dielectric constant (high-k) material having a dielectric constant greater than that of silicon oxide.

In some embodiments, a word line capping pattern 168 may be formed on the first conductive pattern 160. The word line capping pattern 168 may include, as a non-limiting example, silicon nitride.

In some embodiments, the word line WL may be buried inside the substrate 100. For example, the substrate 100 may include a word line trench WT extending in the first direction X. The word line dielectric film 162 may extend along the profile of the word line trench WT. The first conductive pattern 160 may fill a part of the word line trench WT on the word line dielectric film 162. The word line capping pattern 168 may fill another part of the word line trench WT on the first conductive pattern 160. Accordingly, the upper face of the first conductive pattern 160 may be formed to be lower than the upper face of the substrate 100.

Figure 26:
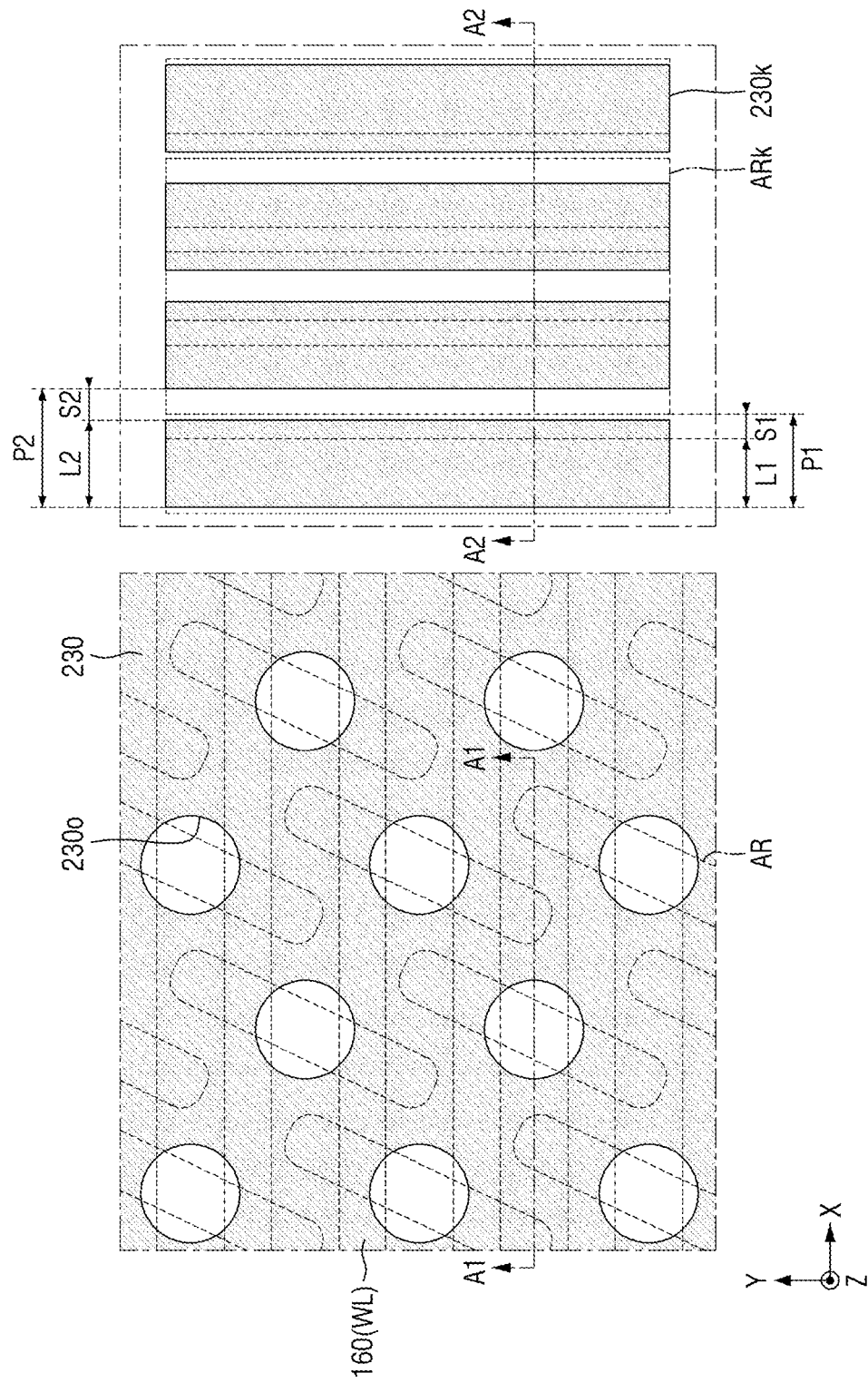
Figure 27:
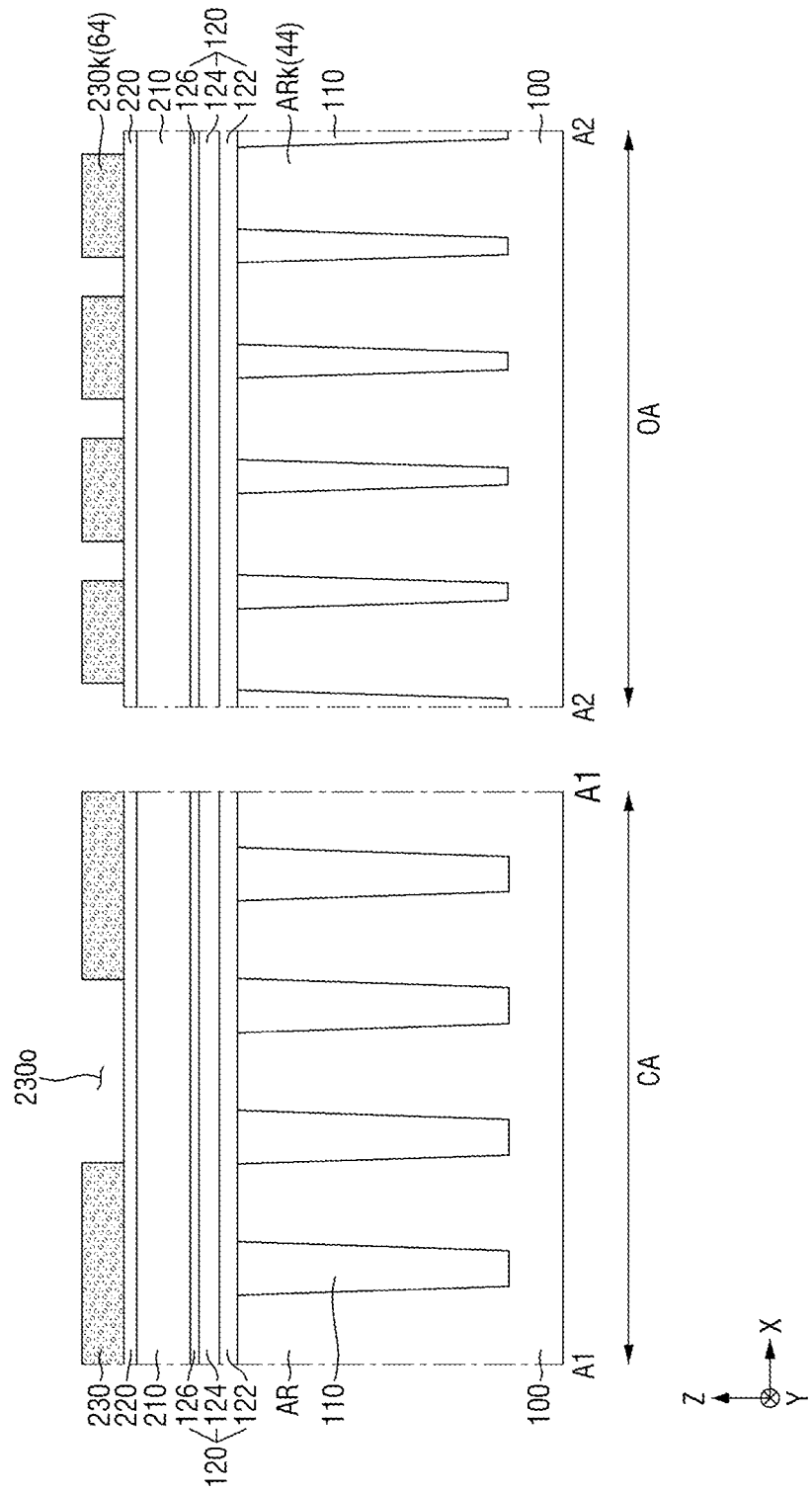

Referring to FIGS. 26 and 27, a base insulating film 120, a hard mask film 210, an anti-reflection film 220, a photoresist pattern 230, and a second overlay key pattern 230k may be formed on the substrate 100 and the element isolation film 110. For reference, FIG. 27 is a cross-sectional view taken along A1-A1 and A2-A2 of FIG. 26.

The base insulating film 120 may be formed on the substrate 100 and the element isolation film 110. The base insulating film 120 may be a single film, or may be a multi-film as shown. For example, the base insulating film 120 may include a first insulating film 122, a second insulating film 124 and a third insulating film 126 that are sequentially stacked on the substrate 100. As an example, the first insulating film 122 may include silicon oxide. The second insulating film 124 may include a material having an etching selectivity different from that of the first insulating film 122. As an example, the second insulating film 124 may include silicon nitride. The third insulating film 126 may include a material having a lower dielectric constant than the second insulating film 124. As an example, the third insulating film 126 may include silicon oxide.

The hard mask film 210 may be stacked on the base insulating film 120. The hard mask film 210 may include a material having an appropriate etching selectivity with the substrate 100, the element isolation film 110 and the base insulating film 120. For example, the hard mask film 210 may include, as a non-limiting example, an amorphous carbon layer (ACL), a spin-on hard mask (SOH) or other carbon-based materials.

The anti-reflection film 220 may be stacked on the hard mask film 210. The anti-reflection film 220 may include, as a non-limiting example, silicon nitride, silicon oxynitride, amorphous silicon, titanium, titanium dioxide, titanium nitride, chromium oxide, carbon, organic anti-reflective coating (ARC) material or combinations thereof.

The photoresist pattern 230 and the second overlay key pattern 230k may be formed on the anti-reflection film 220. The photoresist pattern 230 and the second overlay key pattern 230k may each include a photoresist. For example, a photoresist film may be applied on the anti-reflection film 220 by an application process such as a spin coating process, a dip coating process or a spray coating process. The photoresist pattern 230 and the second overlay key pattern 230k may be photoresist patterns formed as the exposure process and the development process on the photoresist film are performed.

In some embodiments, the photoresist pattern 230 and the second overlay key pattern 230k may each include, as non-limiting examples, a photoresist for extreme ultraviolet (EUV) (about 13.5 nm), photoresist for KrF excimer laser (about 248 nm), photoresist for ArF excimer lasers (about 193 nm) or photoresist for $F_2$ excimer lasers (about 157 nm).

The photoresist pattern 230 may include a plurality of contact holes 230O. The contact holes 230O may define a position at which a first contact trench (CT1 of FIG. 30), which will be described below, is formed. In some embodiments, the contact hole 230O may overlap the centers of each active region AR. In some embodiments, a part of the contact hole 230O may overlap a part of the element isolation film 110.

The second overlay key pattern 230k may be formed at the same level as the photoresist pattern 230. The first overlay key pattern ARk may have a second pitch P2. For example, the second overlay key pattern 230k may include a plurality of second unit patterns spaced apart and arranged periodically at the second pitch P2. The second pitch P2 may be defined as the sum of a second line pitch L2 of each second unit pattern and a second spatial pitch S2 between adjacent second unit patterns. In some embodiments, the plurality of second unit patterns may extend side by side in the first direction X. Although not specifically shown, a plurality of second unit patterns may be arranged rotationally symmetrically to form the second overlay key pattern 230k.

The second pitch P2 of the upper overlay key pattern 64 may be different from the first pitch P1 of the lower overlay key pattern 44. As an example, the second pitch P2 may be greater than the first pitch P1. As long as the first pitch P1 and the second pitch P2 differ from each other, the first line pitch L1 and the second line pitch L2 may be identical to each other, or the first spatial pitch S1 and the second spatial pitch S2 may be identical to each other.

Referring to FIGS. 28 to 31, a first contact trench CT1 is formed, using the photoresist pattern 230 as an etching mask.

In some embodiments, the formation of the first contact trench CT1 may utilize the method for fabricating the conductor device explained above with regard to FIGS. 1 to 9. For example, the first overlay key pattern ARk may be used as the lower overlay key pattern 44, and the second overlay key pattern 230k may be used as the upper overlay key pattern 64.

Specifically, first, an overlay between the first overlay key pattern ARK and the second overlay key pattern 230k may be measured (e.g., S30 of FIG. 3). In some embodiments, measurement of the overlay between the first overlay key pattern ARK and the second overlay key pattern 230k may utilize a Moire effect.

Figure 28:
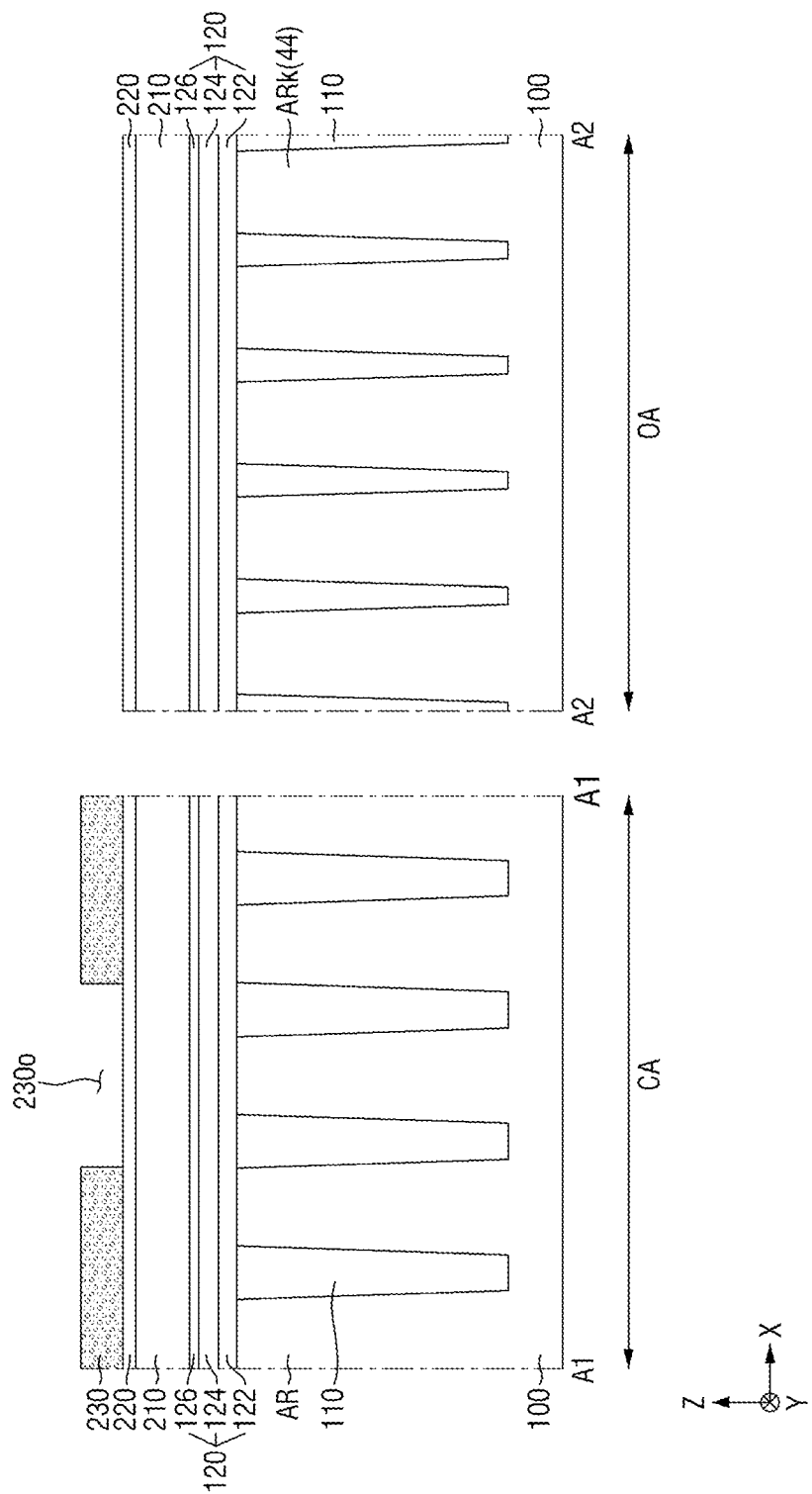

Next, as shown in FIG. 28, the second overlay key pattern 230k may be removed (e.g., S40 of FIG. 3). The second overlay key pattern 230k may be selectively removed with respect to the photoresist pattern 230.

Subsequently, an etching process of using the photoresist pattern 230 as an etching mask may be performed (e.g., S40 of FIG. 3).

Figure 29:
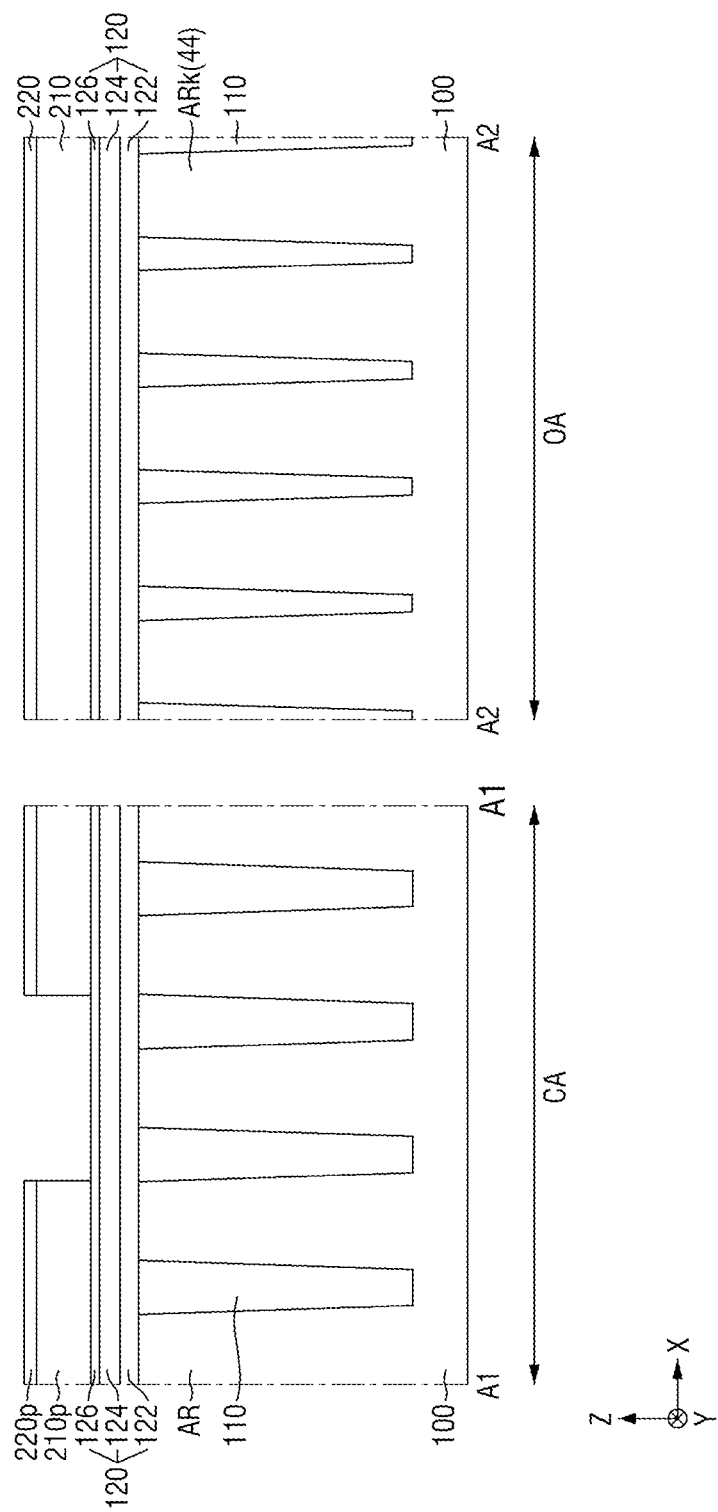

For example, as shown in FIG. 29, a region of the hard mask film 210 and a region of the anti-reflection film 220 exposed by the contact hole 2300 may be etched to form a hard mask pattern 210p and/or an anti-reflection pattern 220p. The hard mask pattern 210p and/or the anti-reflection pattern 220p may define positions at which first contact trenches CT1, which will be described below, will be formed. Although an example in which the anti-reflection pattern 220p remains is only shown, this is only an example. In some implementations, the anti-reflection patterns 220p may be removed in the process of forming the hard mask patterns 210p. On the other hand, as described above with respect to FIGS. 3 and 8, the etching process for the overlay key region OA may be limited.

Figure 30:
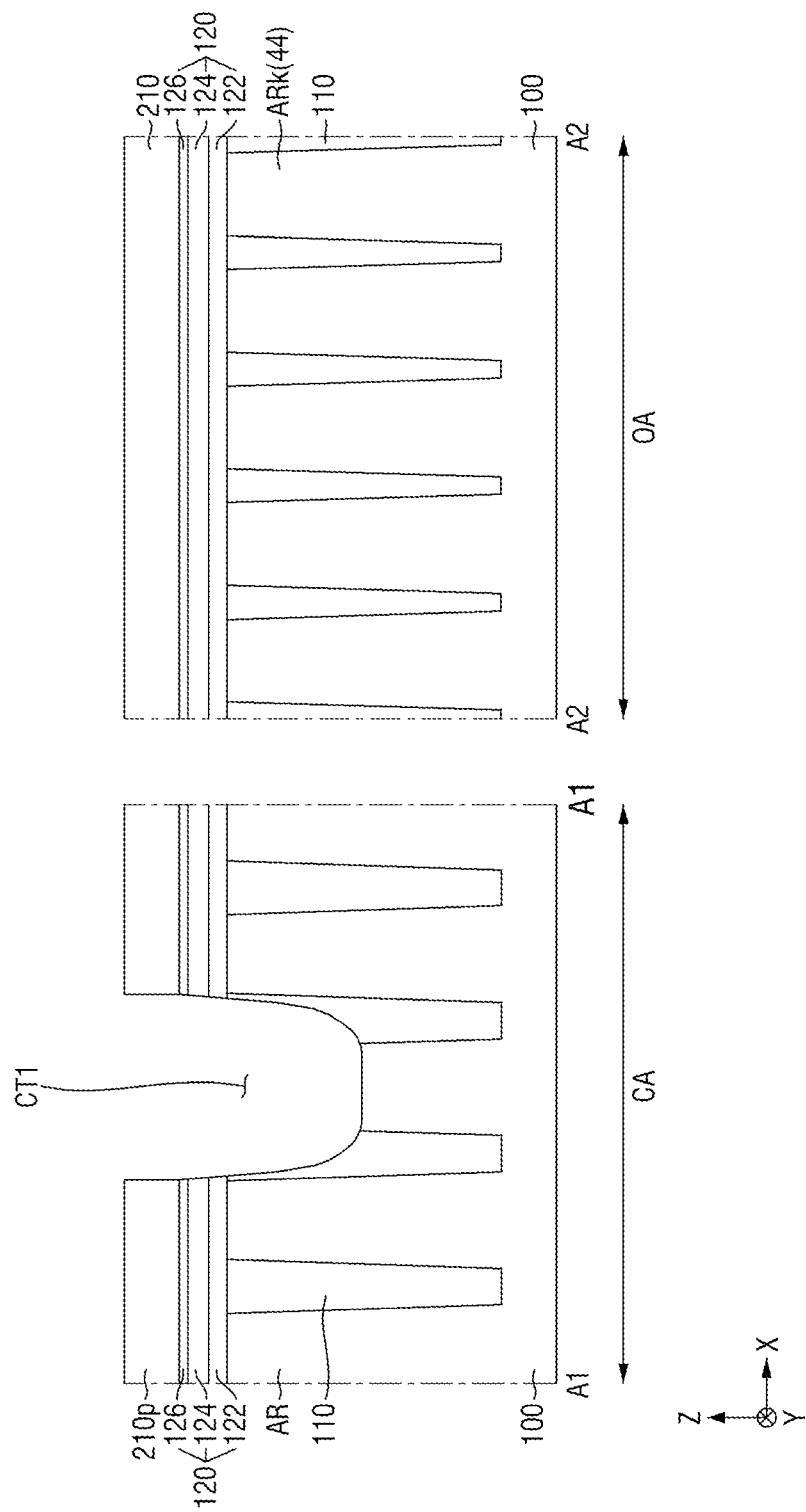

Subsequently, as shown in FIG. 30, an etching process that uses the hard mask pattern 210p as an etching mask may be performed. An etch endpoint of the etching process may be lower than the upper face of the substrate 100 (or the upper face of the active region AR). As a result, the first contact trench CT1, which penetrates the base insulating film 120 to expose at least a part of the active region AR, may be formed. In some embodiments, the first contact trench CT1 may expose the center of the active region AR. Meanwhile, since the etching process for the overlay key region OA may be restricted as described above, the first overlay key pattern ARk on the overlay key region OA may not be etched by the etching process.

Figure 31:
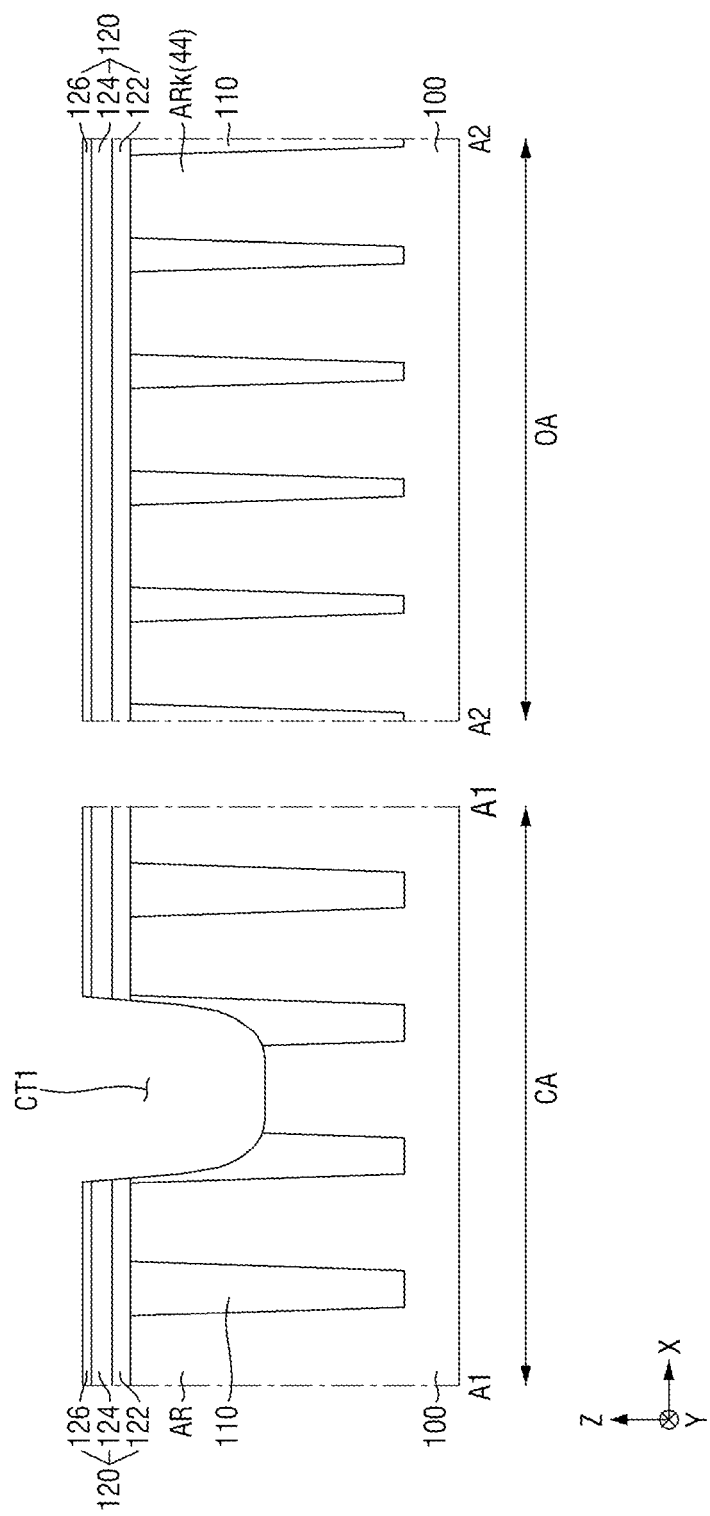

After forming the first contact trench CT1, the hard mask pattern 210p may be removed as shown in FIG. 31. Accordingly, the first contact trenches CT1 which is precisely aligned with the active regions AR may be formed.

Figure 32:
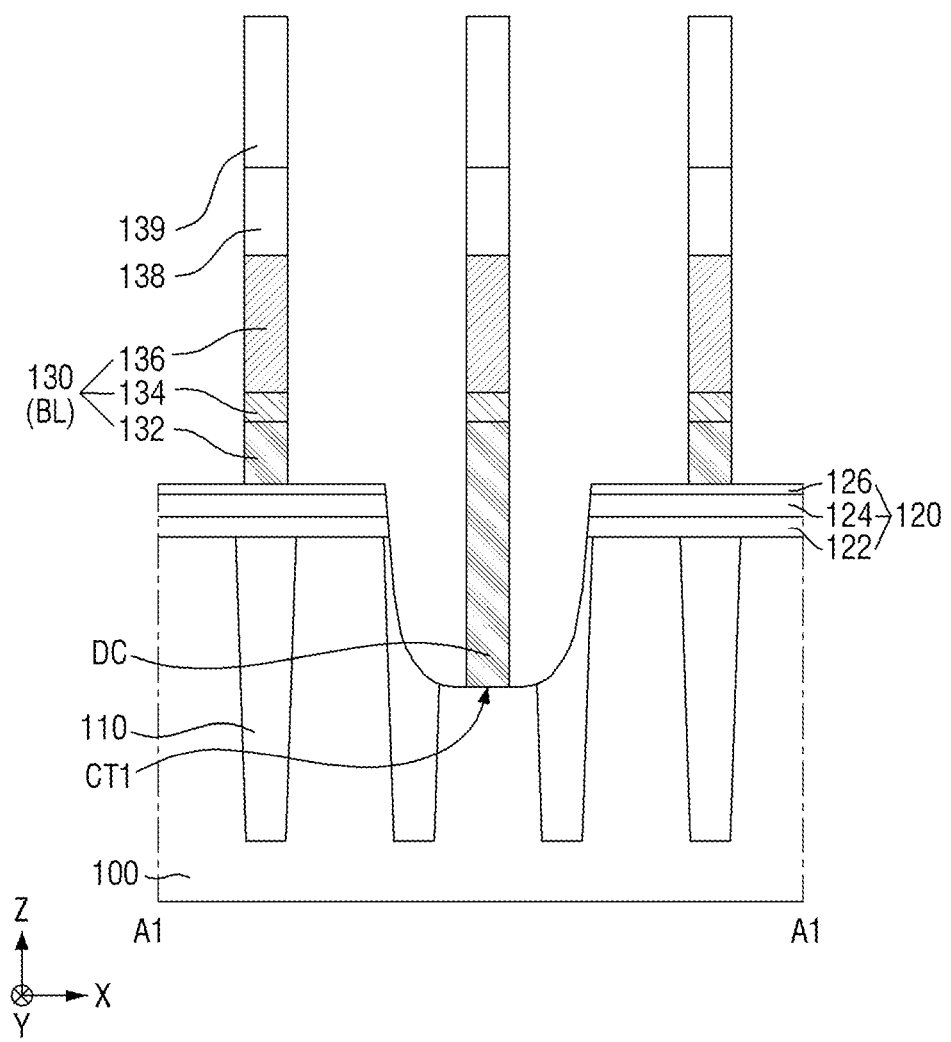

Referring to FIG. 32, bit lines BL are formed on the substrate 100, the element isolation film 110 and the base insulating film 120.

The bit lines BL may extend long in the second direction Y across the active regions AR and the word lines WL. For example, the bit lines BL may diagonally cross the active regions AR and vertically cross the word lines WL. A plurality of bit lines BL may extend parallel to each other.

For example, a plurality of bit lines BL spaced apart at regular intervals and extending in the second direction Y may be formed.

The bit lines BL may include second conductive patterns 130. The second conductive pattern 130 may be a single film, or may be a multi-layer film as shown. For example, the second conductive pattern 130 may include a third sub-conductive pattern 132, a fourth sub-conductive pattern 134 and a fifth sub-conductive pattern 136 that are sequentially stacked on the substrate 100.

The third sub-conductive pattern 132, the fourth sub-conductive pattern 134, and the fifth sub-conductive pattern 136 may each include, as a non-limiting example, at least one of polysilicon, TiN, TiSiN, tungsten, tungsten silicide, and combinations thereof. For example, the third sub-conductive pattern 132 may include polysilicon, the fourth sub-conductive pattern 134 may include TiSiN, and the fifth sub-conductive pattern 136 may include tungsten.

A first bit line capping pattern 138 and a second bit line capping pattern 139 may be sequentially formed on the second conductive pattern 130. The first bit line capping pattern 138 and the second bit line capping pattern 139 may extend along the upper face of the second conductive pattern 130. The first bit line capping pattern 138 and the second bit line capping pattern 139 may include, but are not limited to, silicon nitride.

A direct contact DC may be formed on the substrate 100 and the element isolation film 110. The direct contact DC may penetrate the base insulating film 120, and electrically connect the active region AR of the substrate 100 and the bit line BL. For example, the direct contact DC may be formed in the first contact trench CT1 to connect the center of the active region AR and the second conductive pattern 130.

Figure 33:
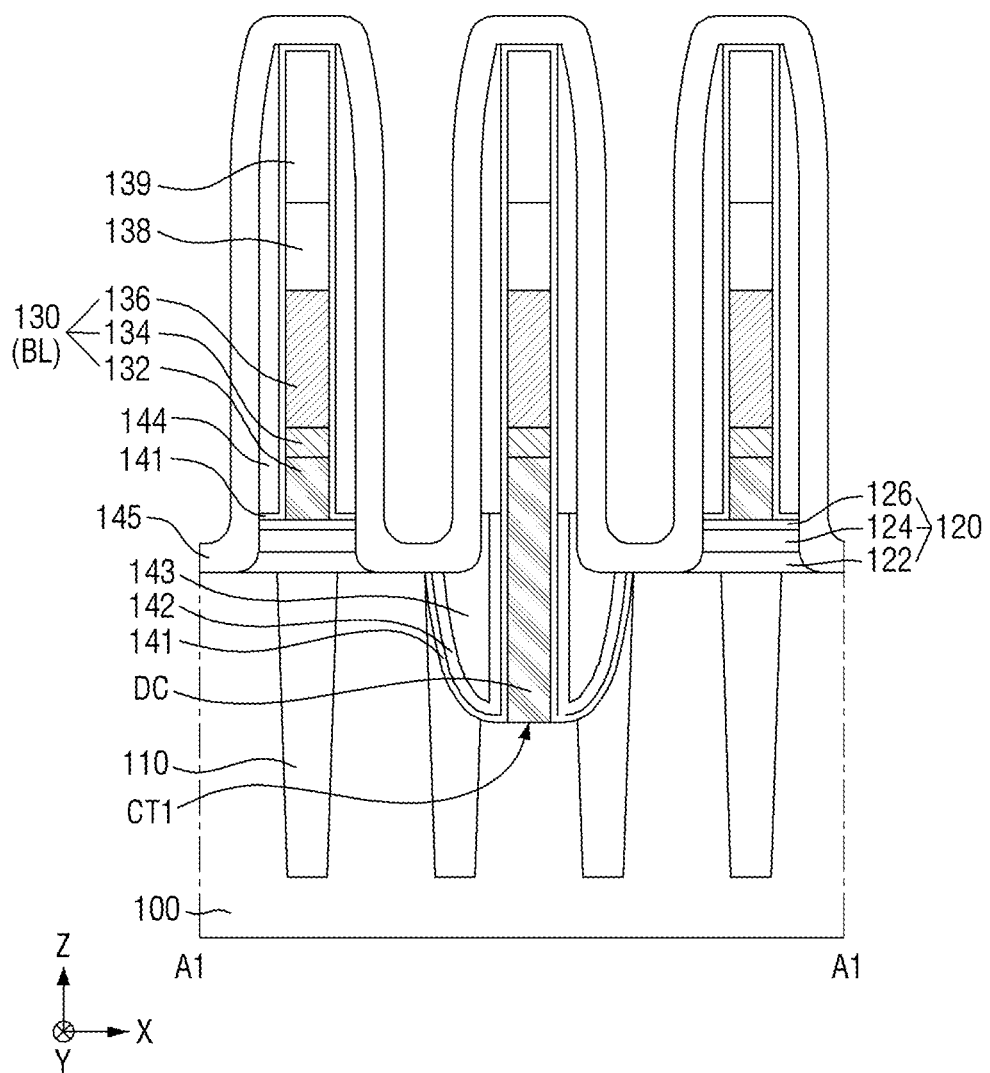

Referring to FIG. 33, bit line spacers 140 may be formed on the side faces of the bit lines BL.

For example, bit line spacers 140 extending along the side face of the direct contact DC, the side face of the second conductive pattern 130, the side face of the first bit line capping pattern 138, and the side face and the upper face of the second bit line capping pattern 139 may be formed. In some embodiments, the bit line spacer 140 may include first spacers 141, second spacers 142, third spacers 143, fourth spacers 144 and fifth spacers 145.

The first spacers 141 may extend along the side faces of the bit lines BL. For example, the first spacers 141 may extend along the side faces of the second conductive pattern 130, the first bit line capping pattern 138 and the second bit line capping pattern 139.

The first spacer 141 may extend along the side faces of the bit lines BL and the upper face of the base insulating film 120 in the region in which the first contact trench CT1 is not formed. In the region in which the first contact trench CT1 is formed, the first spacer 141 may extend along the side face of the bit line BL, the side face of the direct contact DC, and the first contact trench CT1. In some embodiments, the first spacer 141 may come into contact with the bit line BL and the direct contact DC.

The second spacer 142 may be formed on the first spacer 141 in the first contact trench CT1. For example, the second spacer 142 may extend along the profile of the first spacer 141 inside the first contact trench CT1.

The third spacer 143 may be formed on the second spacer 142 in the first contact trench CT1. The third spacer 143 may fill a region of the first contact trench CT1 that remains after the first spacer 141 and the second spacer 142 are formed.

The fourth spacer 144 may be formed on the second spacer 142 and the third spacer 143. The fourth spacer 144 may extend along at least a part of the side face of the bit line BL. For example, the fourth spacer 144 may extend along a part of the side face of the first spacer 141.

The fifth spacer 145 may be formed on the third spacer 143. The fifth spacer 145 may extend along at least a part of the side face of the bit line BL. For example, the fifth spacer 145 may extend along the side face of the fourth spacer 144.

In some embodiments, a lower face of the fifth spacer 145 may be formed to be lower than the uppermost face of the third spacer 143. For example, a lower part of the fifth spacer 145 may have a shape that is buried inside the third spacer 143.

Each of the first spacer 141, the second spacer 142, the third spacer 143, the fourth spacer 144, and the fifth spacer 145 may include at least one of silicon oxide, silicon oxynitride, silicon nitride, and combinations thereof. As an example, the first spacer 141 may include silicon nitride, the second spacer 142 may include silicon oxide, the third spacer 143 may include silicon nitride, the fourth spacer 144 may include silicon oxide, and the fifth spacer 145 may include silicon nitride.

In some embodiments, the bit line spacer 140 may include an air spacer. The air spacer 140A may consist of air or voids. Since the air spacer 140A has a lower dielectric constant than silicon oxide, it is possible to effectively reduce the parasitic capacitance of the semiconductor memory device according to some embodiments. For example, the fourth spacer 144 may be an air spacer.

Figure 34:
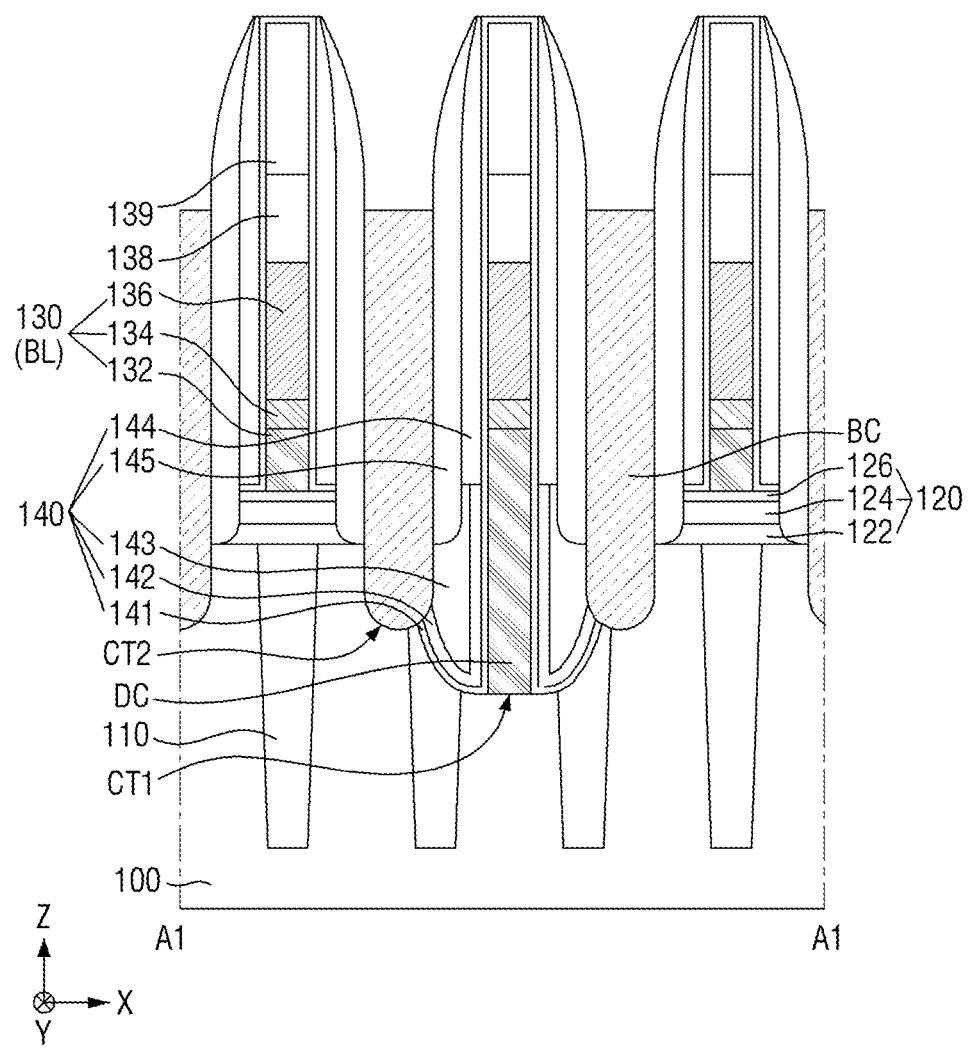

Referring to FIG. 34, buried contacts BC may be formed on the substrate 100 and the element isolation film 110.

For example, a second contact trench CT2 that exposes a part of the active region AR may be formed inside the substrate 100. In some embodiments, the second contact trench CT2 may expose both ends of the active region AR. The buried contact BC that fills the second contact trench CT2 may then be formed.

In some embodiments, the upper face of the buried contact BC may be formed to be lower than the upper face of the second bit line capping pattern 139. For example, an etchback process may be performed so that the upper face of the buried contact BC becomes lower than the upper face of the second bit line capping pattern 139. Therefore, buried contacts BC that form a plurality of isolated regions may be formed. The buried contacts BC may include, but are not limited to, polysilicon.

Figure 35:
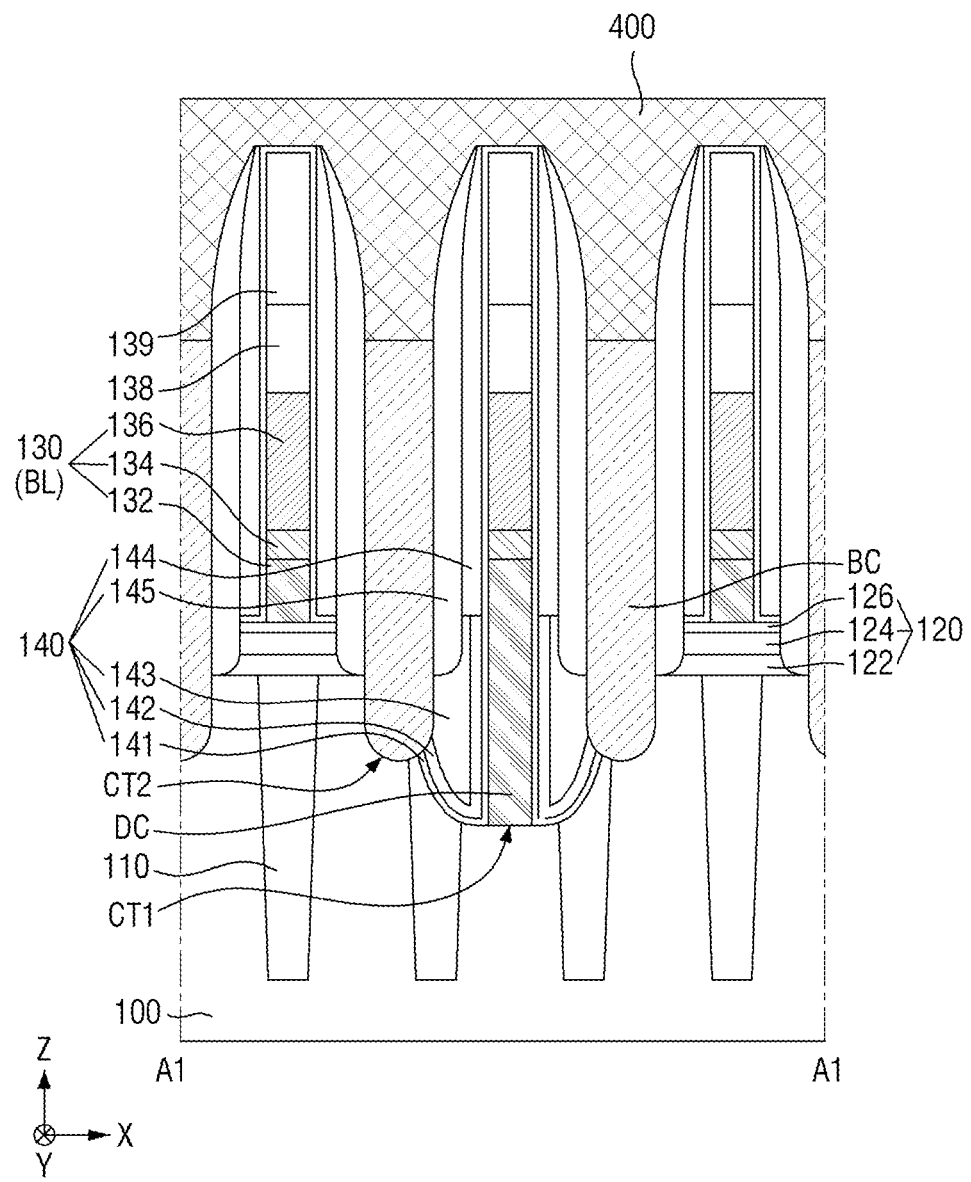

Referring to FIG. 35, a landing conductive film 400 may be formed.

The landing conductive film 400 may be electrically connected to the buried contact BC. The landing conductive film 400 may include, for example, tungsten (W), as a non-limiting example. In some embodiments, an upper face of the landing conductive film 400 may be formed to be higher than the upper face of the second bit line capping pattern 139.

Figure 36:
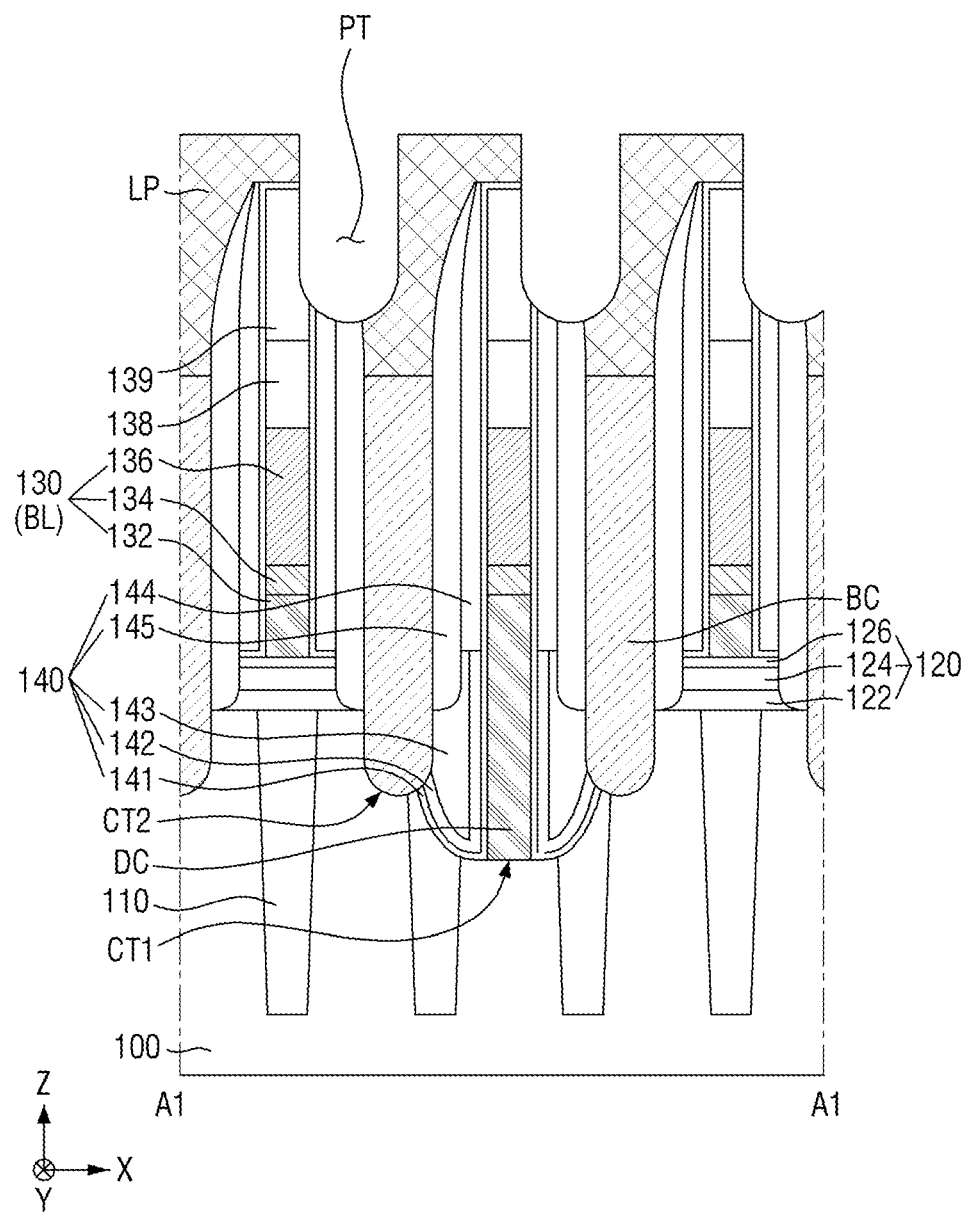

Referring to FIG. 36, an etching process of etching the landing conductive film 400 may be performed to form a plurality of landing pads LP.

For example, a pad trench PT that defines a plurality of landing pads LP may be formed. In some embodiments, a part of the pad trench PT may expose a part of the second bit line capping pattern 139. For example, the pad trench PT may extend from the upper face of the landing pad LP, and may be formed to have a face that is lower than the upper face of the second bit line capping pattern 139. Therefore, the plurality of landing pads LP may be separated from each other by the second bit line capping pattern 139 and the pad trench PT.

In some embodiments, the formation of the pad trench PT may utilize the method for fabricating the conductor device explained above using FIGS. 1 to 9. For example, the second bit line capping pattern 139 may be used as the lower overlay key pattern 44, and the photoresist pattern for forming the pad trench PT may include the second overlay key pattern 230k. Therefore, a landing pad LP that is precisely aligned with the bit line BL may be formed.

Figure 37:
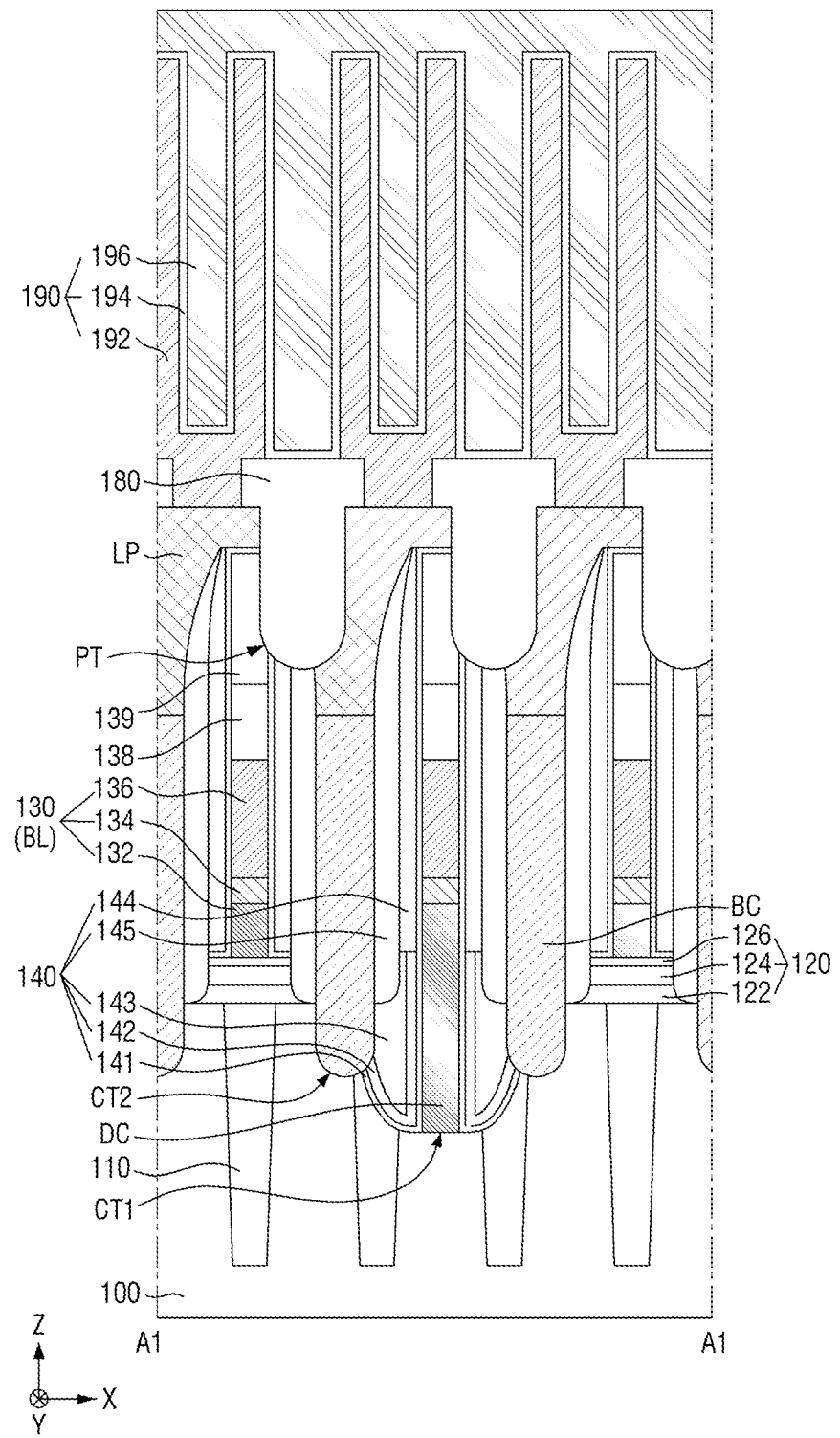

Referring to FIG. 37, an interlayer insulating film 180 and a capacitor 190 may be formed on the landing pad LP.

For example, the interlayer insulating film 180 that fills the pad trench PT may be formed. A plurality of landing pads LP that form a plurality of isolated regions separated from each other by the interlayer insulating film 180 may be formed. In some embodiments, the interlayer insulating film 180 may be patterned to expose at least a part of the upper faces of each landing pad LP.

Subsequently, a capacitor 190 may be formed on the interlayer insulating film 180 and the landing pad LP. The capacitor 190 may be connected to the landing pad LP exposed by the interlayer insulating film 180. The capacitor 190 may be electrically connected to the active region AR of the substrate 100 through the buried contact BC and the landing pad LP. Accordingly, the capacitor 190 may be controlled by the bit line BL and the word line WL to store data.

In some embodiments, the capacitor 190 may include a lower electrode 192, a capacitor dielectric film 194, and an upper electrode 196. The capacitor 190 may store electric charges in the capacitor dielectric film 194, using a potential difference generated between the lower electrode 192 and the upper electrode 196.

The lower electrode 192 and the upper electrode 196 may include, as non-limiting examples, doped polysilicon, metal or metal nitride. In addition, the capacitor dielectric film 194 may include, as non-limiting examples, silicon oxide or a high dielectric constant material.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   forming a lower pattern including a lower overlay key pattern having a first pitch, on a substrate;
   forming an upper pattern including an upper overlay key pattern having a second pitch different from the first pitch, on the lower pattern;
   measuring an overlay between the lower overlay key pattern and the upper overlay key pattern;
   removing the upper overlay key pattern; and
   performing an etching process using the upper pattern as an etching mask, after removing the upper overlay key pattern.

2. The method for fabricating the semiconductor device as claimed in claim 1, wherein the measuring the overlay includes using a Moire pattern formed by the lower overlay key pattern and the upper overlay key pattern.

3. The method for fabricating the semiconductor device as claimed in claim 1, wherein an etch endpoint of the etching process is lower than an upper face of the lower pattern.

4. The method for fabricating the semiconductor device as claimed in claim 1, wherein the lower overlay key pattern is not etched by the etching process.

5. The method for fabricating the semiconductor device as claimed in claim 1, wherein the upper pattern includes a photoresist.

6. The method for fabricating the semiconductor device as claimed in claim 5, wherein the measuring the overlay between the lower overlay key pattern and the upper overlay key pattern includes performing an after cleaning inspection (ACI).

7. The method for fabricating the semiconductor device as claimed in claim 1, wherein a difference between the first pitch and the second pitch is 100 nm to 300 nm.

8. A semiconductor device fabricated by the method as claimed in claim 1.

9. A method for fabricating a semiconductor device, the method comprising:
   providing a substrate including a cell region and an overlay key region;
   forming a lower pattern including a lower cell pattern on the cell region and a lower overlay key pattern on the overlay key region, the lower overlay key pattern having a first pitch;
   forming an upper pattern including an upper cell pattern on the lower cell pattern and an upper overlay key pattern on the lower overlay key pattern, the upper overlay key pattern having a second pitch different from the first pitch;
   measuring an overlay between the lower overlay key pattern and the upper overlay key pattern, using a Moire pattern formed by the lower overlay key pattern and the upper overlay key pattern;
   removing the upper overlay key pattern; and
   after removing the upper overlay key pattern, performing an etching process using the upper cell pattern as an etch mask, wherein an etch endpoint of the etching process is lower than an upper face of the lower cell pattern.

10. The method for fabricating the semiconductor device as claimed in claim 9, wherein removing the upper overlay key pattern includes:
    forming a mask film that covers the cell region;
    removing the upper overlay key pattern exposed by the mask film; and
    removing the mask film.

11. The method for fabricating the semiconductor device as claimed in claim 9, wherein at least a part of the lower cell pattern is etched by the etching process.

12. The method for fabricating the semiconductor device as claimed in claim 9, wherein the lower overlay key pattern is not etched by the etching process.

13. The method for fabricating the semiconductor device as claimed in claim 9, wherein the upper pattern includes a photoresist.

14. The method for fabricating the semiconductor device as claimed in claim 9, wherein a difference between the first pitch and the second pitch is 100 nm to 300 nm.

15. A semiconductor device fabricated by the method as claimed in claim 9.

16. A method for fabricating a semiconductor device, the method comprising:
    providing a substrate including a cell region and an overlay key region;
    forming a lower pattern including a lower cell pattern on the cell region and a lower overlay key pattern on the overlay key region, the lower overlay key pattern having a first pitch;
    forming an upper pattern including an upper cell pattern on the lower cell pattern and an upper overlay key pattern on the lower overlay key pattern, the upper overlay key pattern having a second pitch different from the first pitch;
    removing the upper overlay key pattern; and
    after removing the upper overlay key pattern, performing an etching process using the upper cell pattern as an etching mask to remove at least a part of the lower cell pattern.

17. The method for fabricating the semiconductor device as claimed in claim 16, wherein after performing the etching process, the lower cell pattern includes a recess formed by the etching process.

18. The method for fabricating the semiconductor device as claimed in claim 16, wherein the lower overlay key pattern is not etched by the etching process.

19. The method for fabricating the semiconductor device as claimed in claim 16, wherein the upper pattern includes a photoresist.

20. A semiconductor device fabricated by the method as claimed in claim 16.

* * * * *